US008320045B2

(12) United States Patent
Martinez Anton et al.

(10) Patent No.: US 8,320,045 B2
(45) Date of Patent: Nov. 27, 2012

(54) LIGHT COLLECTION AND CONCENTRATION SYSTEM

(75) Inventors: Juan Carlos Martinez Anton, Madrid (ES); Oscar Pereles Ligero, Denver, CO (US); Daniel Vazquez Molini, Madrid (ES); Eusebio Bernabeu Martinez, Madrid (ES); Sebastian Caparros Jimenez, Rochester, NY (US)

(73) Assignee: Abengoa Solar New Technologies, S.A., Seville (ES)

( * ) Notice: Subject to any disclaimer, the term of this patent is extended or adjusted under 35 U.S.C. 154(b) by 714 days.

(21) Appl. No.: 12/534,908

(22) Filed: Aug. 4, 2009

(65) Prior Publication Data

US 2010/0116319 A1    May 13, 2010

Related U.S. Application Data

(63) Continuation-in-part of application No. 12/389,466, filed on Feb. 20, 2009.

(30) Foreign Application Priority Data

Nov. 12, 2008  (ES) .................................. 200803237

(51) Int. Cl.
G02B 27/10    (2006.01)
H01L 31/042   (2006.01)
H01L 31/00    (2006.01)
(52) U.S. Cl. .................. 359/619; 136/246; 136/259
(58) Field of Classification Search .................. 359/619, 359/853; 136/246, 259
See application file for complete search history.

(56) References Cited

U.S. PATENT DOCUMENTS

| 4,482,778 A | 11/1984 | Anderson |
| 7,160,522 B2 | 1/2007 | Dominguez et al. |
| 2003/0116184 A1 | 6/2003 | Lewis |
| 2008/0271776 A1 | 11/2008 | Paul |

FOREIGN PATENT DOCUMENTS

WO    WO 2006035698 A1 *    4/2006

* cited by examiner

*Primary Examiner* — William Choi
(74) *Attorney, Agent, or Firm* — William Greener; Bond, Schoeneck & King, PLLC

(57) ABSTRACT

A light collection and concentration system includes a primary light concentrator, a light transport structure, and a light directing structure optically associated with the primary light concentrator. The system may include an optional secondary light concentrator. Each unit-system includes a plurality of the primary light concentrators and a respective plurality of the light directing structures, and only a single light transport structure. A photo-voltaic (PV) cell may advantageously be associated with each unit-system. Solar radiation is focused by the primary concentrators onto respective light directing structures incorporated in a low aspect ratio, sheet-type waveguide light transport structure. Each respective light directing structure intercepts the focused light and deflects it transversely to travel along the length of the light transport structure primarily via total internal reflection (TIR) towards an exit-end of the light transport structure, where it can be input to the PV cell. The optional secondary light concentrator may further concentrate the light out-coupled from the transport structure into the PV cell.

28 Claims, 33 Drawing Sheets

(A)

(B)

(C)

FIF. 5A

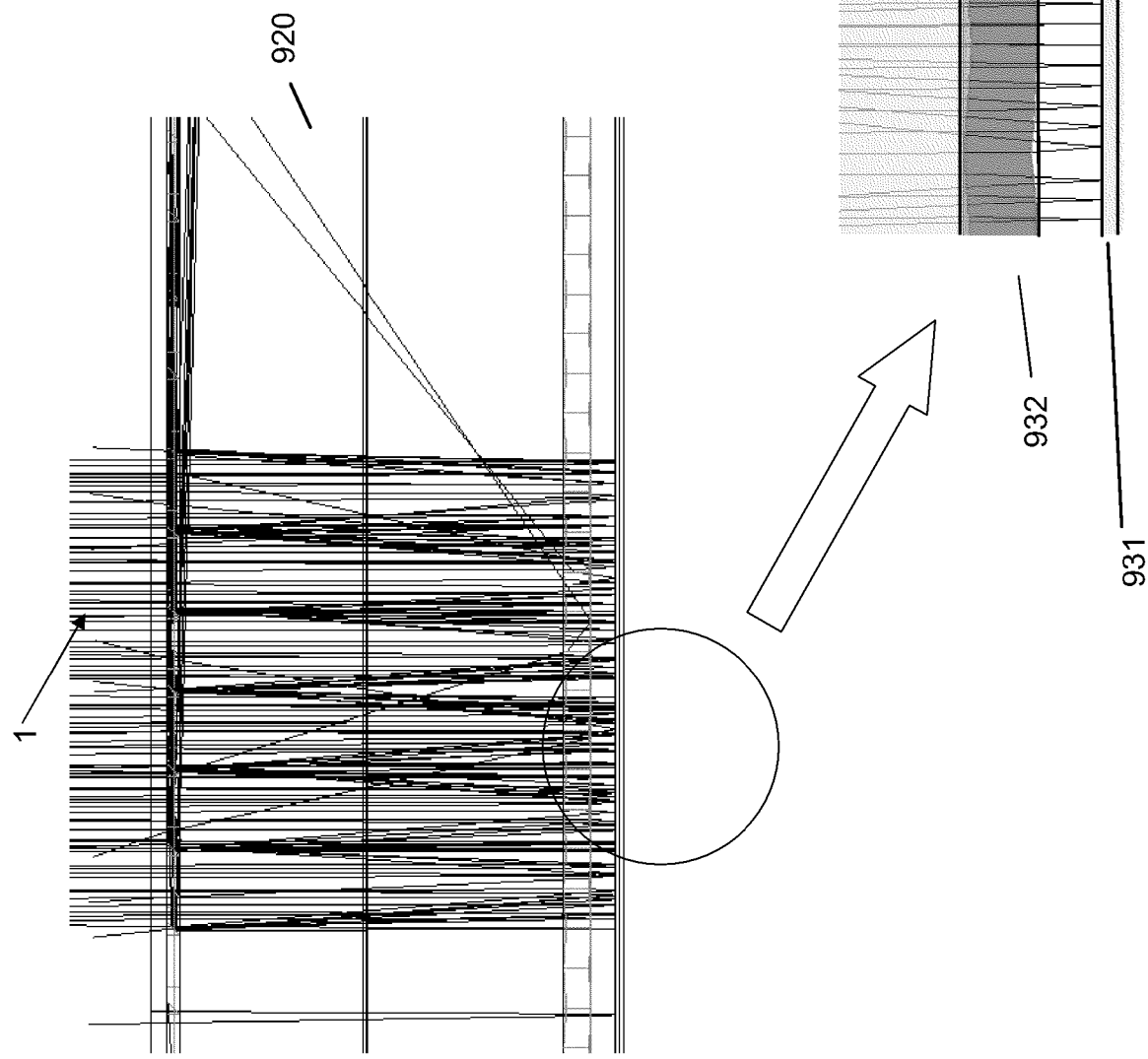
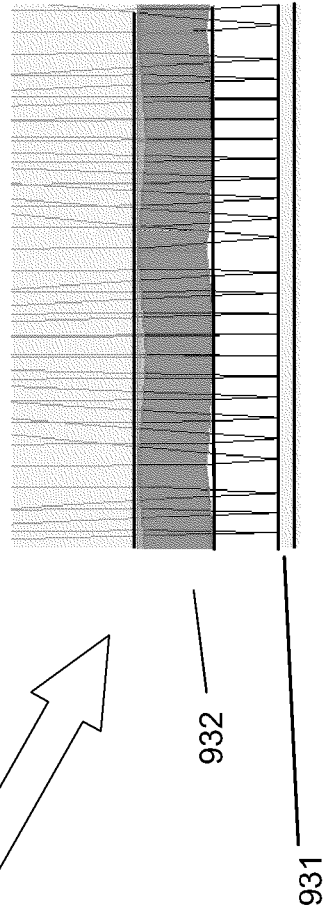

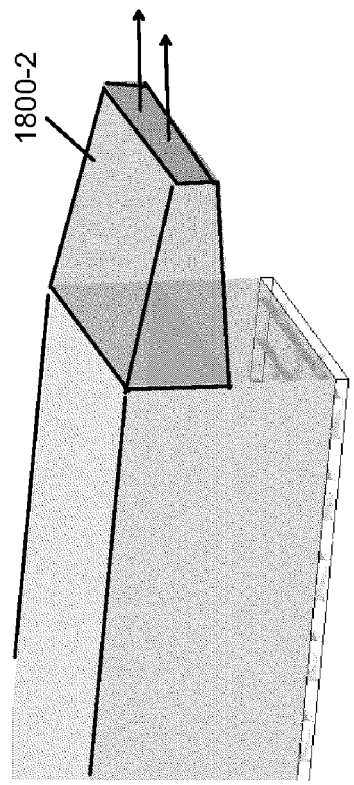
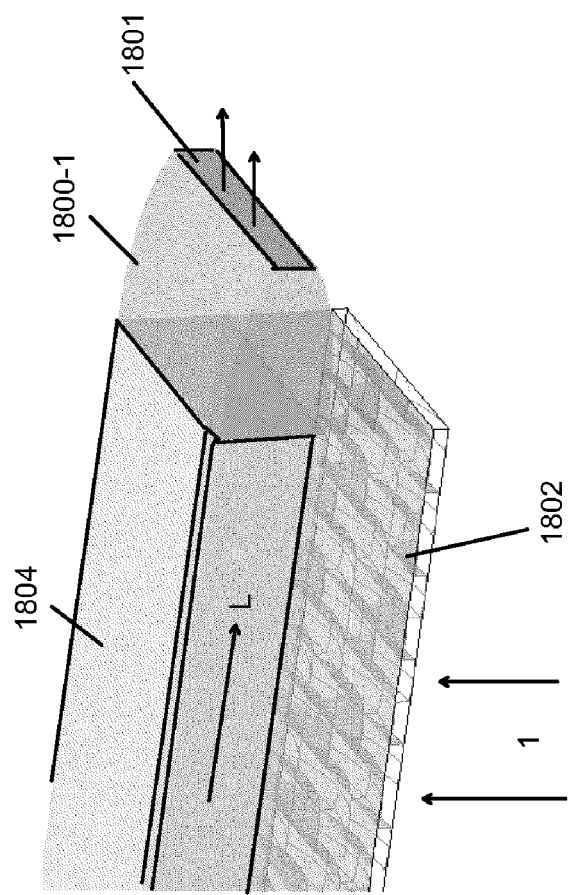
FIG. 18B
FIG. 18A

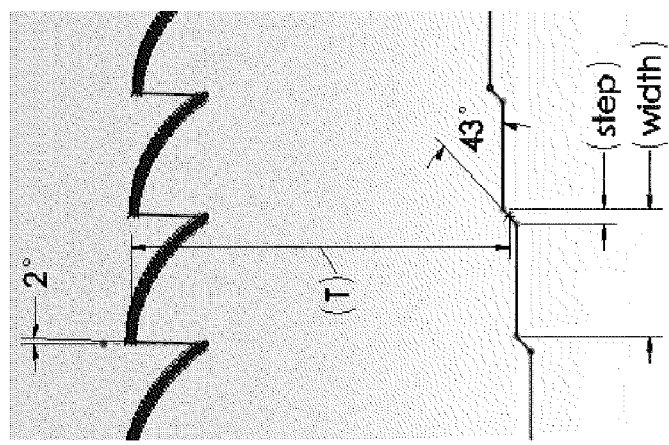
(D)
FIG. 19 (con't)

LIGHT COLLECTION AND CONCENTRATION SYSTEM

RELATED APPLICATION DATA

This application is a continuation-in-part of U.S. Ser. No. 12/389,466 filed on Feb. 20, 2009, which itself claims priority to Spanish priority application No. P200803237 filed in the Spanish Patent and Trademark Office on Nov. 12, 2008.

GOVERNMENT SPONSORSHIP

Not applicable.

BACKGROUND

1. Field of the Invention

Embodiments of the invention generally pertain to a light collection and concentration system. More particularly, embodiments on the invention are directed to a solar radiation collection and concentration system and components thereof; methods for light collection, transport, and concentration; and applications of said solar radiation collection and concentration system and components thereof; and, most particularly to a solar energy-concentrated photo-voltaic (CPV) system.

2. Description of Related Art

Numerous solar energy systems and components that make up these systems have been proposed and developed over the $20^{th}$ century to present. Despite this longstanding effort and the enormous resources devoted to it, solar energy systems available today are not competitive in terms of cost and efficiency with alternative forms of energy production for commercial and residential settings.

FIG. 1 is a cross sectional view that schematically illustrates a generic conventional solar photovoltaic system. Solar radiation 1 is incident on a light collector 2, e.g., a lens. The lens concentrates (focuses) the collected light into an active secondary component 31 that can transport the collected energy to a photovoltaic (PV) cell 8. As shown in FIG. 1, the system comprises a linear array of three units, each containing a lens, a secondary component, and a PV cell.

A well known design goal for solar collection systems is unit size reduction with increased efficiency. That is, solar energy systems may benefit commercially if they are relatively thin, compact, easily deployable, accessible for servicing, and cost efficient. As seen in FIG. 1, there is a one-to-one correspondence between each light collection lens and PV cell.

FIG. 2 illustrates in a manner similar to that of FIG. 1 a more compact design for the system. Each collection lens 2 in FIG. 1 has been replaced by two smaller diameter collection lenses $2_1$ and $2_2$, which together collect the same light flux as the single larger lens 2 in FIG. 1. Although the system deployed in FIG. 2 is thinner than the FIG. 1 system, the size reduction is at a cost of twice the number of active components $31_1$, $31_2$ and PV cells $8_1$, $8_2$. Similarly, if lens component 2 were split into four smaller lenses, the number of active components and PV cells would increase by a factor of four, and so on. The resulting increase in number of components raises both the system cost and potential system failure rate.

In view of these and other known challenges in the solar energy art, the inventors have recognized the benefits and advantages of solar energy systems and associated components that are thinner, more compact, more efficient, more reliable, less costly, and otherwise improved over the current state of the art.

SUMMARY

An embodiment of the invention is directed to a light collection and concentration system. The system includes a primary light concentrator; a single light transport structure; and, a light directing structure. The system may include a secondary light concentrator. The system may further include a PV cell associated with each unit-system that includes a plurality of the primary light concentrators and a respective plurality of the light directing structures, a single light transport structure and, optionally, a secondary light concentrator.

Illustratively, solar radiation is focused at normal incidence onto the large area surface of a thin, sheet-type waveguide transport structure. A light directing structure intercepts the focused light at or in the transport structure and deflects it generally transversely to travel along the planar length of the transport structure. A secondary light concentrator may be provided to concentrate the light to be out-coupled from an exit-end of the waveguide and into a PV cell or structure directing the light to a PV cell.

According to non-limiting, alternative aspects, the primary light concentrator may be any of a variety of known elements that can collect incident solar radiation and concentrate this incident radiation into a smaller area. Refractive elements (e.g., lenses), reflective elements (e.g., mirrors), and diffractive elements (e.g., gratings, holograms) are non-limiting examples of primary light concentrators that may be used. According to various non-limiting aspects, a single primary light concentrator may take the form of a conventional focusing lens, a Fresnel lens, a straight cylindrical lens, a curved cylindrical lens (e.g., a full annulus or arc segment thereof), a parabolic mirror (or segment thereof), and others known in the art. As such, unit-systems may comprise, but are not limited to, primary light concentrator sections in the forms of a spaced, non-overlapping lens array (e.g., square, hexagonal, triangular, other array shapes), a straight, cylindrical lenticular-type concentrator sheet, and a circular (or arc segment thereof)-annular, cylindrical lenticular-type concentrator sheet.

The single light transport structure associated with a unit-system is in the form of a thin sheet waveguide; i.e., having a thickness, T, much less than the general length, L, of the structure; thus having a low aspect ratio defined by T/L. The structure will be bounded by upper (top) and lower (bottom) surfaces that define the boundary between a higher index of refraction within the structure and a lower index of refraction outside of the structure so as to facilitate light propagation along the length of the interior of the structure via total internal reflection (TIR) as known in the art. The structure will have an end (hereinafter, exit-end) wherefrom the light propagates out of the transport structure. According to various non-limiting aspects, the interior of the structure may comprise solid, liquid, or gaseous material suitable to propagate light therein by TIR with or without diffuse and/or specular reflection.

The aforementioned light directing structure provides a means by which concentrated light from the primary light concentrator is input to and/or directed in a desired propagation direction in the light transport structure towards the exit-end of the transport structure. Thus the light directing structure can suitably function to capture the focal spot, for example, from the primary light concentrator that is for the most part normally incident on the top or bottom surface of the transport structure and redirect it, illustratively, at 90 degrees, in order for it to propagate along the length of the transport structure towards the exit-end thereof. In a non-limiting aspect, the light directing structure may be a light reflecting surface laterally cut into the top or bottom surface of the transport structure that reflects input light via TIR, specular reflection, diffuse reflection, diffraction, multiple beam interference, and other known optical processes for changing the direction of a propagating light beam. In each single transport structure, multiple light directing structures will be respectively associated with multiple primary light concentrators of a unit-system. Thus each light directing structure may be a finite or a continuous structure depending upon the configuration and geometry of each of the respective primary light concentrator(s). According to non-limiting aspects, the top and/or bottom surfaces of the transport structure that contains the light directing structures as integral surface portions thereof may have a flat, a staircase, or a stepped (echelon-shaped) top or bottom surface that may be planar or curved. According to alternative aspects, the light directing structures may be disposed in the interior of the transport structure in the form of prisms, gratings, quantum dots, photonic crystals, and other structures that would be able to provide the required function of the light directing structures with or without primary focusing elements.

According to an embodiment, an equi-depth light collection and concentration system includes a light concentrating layer having a first section and at least a second section, a first light transport layer characterized by an index of refraction $n_{1-1}$, including a plurality of light directing elements disposed in at least a portion of one of the top and bottom surfaces thereof in optical registration with the first section of the light concentrating layer, and having a respective side-end primary light exit surface, a first light transmissive medium layer characterized by an index of refraction $n_{2-1}$, where $n_{2-1} < n_{1-1}$, disposed immediately adjacent the light concentrating layer and the first light transport layer, at least a second light transport layer characterized by an index of refraction $n_{1-2}$, including a plurality of light directing elements disposed in at least one of the top and bottom surfaces thereof and in respective optical registration with the at least second section of the light concentrating layer, and having a respective side-end primary light exit surface, and a respective at least second light transmissive medium layer characterized by an index of refraction $n_{2-2}$, where $n_{2-2} < n_{1-2}$, disposed immediately adjacent the first light transport layer and the second light transport layer.

In an embodiment, a compound light collection and concentration system includes a first collector comprising a first light concentrating layer, a first light transport layer characterized by an index of refraction $n_{1-1}$, having a respective side-end primary light exit surface, and further including a plurality of light-directing elements disposed in a bottom surface thereof and extending inwardly therefrom at an angle to the bottom surface, in optical registration with the first light concentrating layer, and a first light transmissive medium layer characterized by an index of refraction $n_{2-1}$, where $n_{2-1} < n_{1-1}$, disposed between the first light concentrating layer and the first light transport layer; and, at least a second collector having an outer portion including a second light concentrating layer, a second light transport layer characterized by an index of refraction $n_{1-2}$, and further including a plurality of light-directing elements disposed in a portion of a bottom surface thereof and extending inwardly therefrom at an angle to the bottom surface, in optical registration with the second light concentrating layer, and a second light transmissive medium layer characterized by an index of refraction $n_{2-2}$, where $n_{2-2} < n_{1-2}$, disposed between the second light concentrating layer and the second light transport layer, and, an inner portion consisting of a plane parallel region of the second light transport layer having a respective side-end primary light exit surface, wherein the inner portion is disposed adjacent underneath the first light transport layer, and a light transmissive medium layer characterized by an index of refraction $n'_{2-2}$, where $n'_{2-2} \geq n_{2-2}$ and $< n_{1-2}$, disposed immediately adjacent a top surface of the plane parallel region of the second light transport layer.

In an aspect of the compound light collection and concentration system embodiment, the system further comprises at least a third collector having an outer portion including a third light concentrating layer, a third light transport layer characterized by an index of refraction $n_{1-3}$, and further including a plurality of light-directing elements disposed in a portion of a bottom surface thereof and extending inwardly therefrom at an angle to the bottom surface, in optical registration with the third light concentrating layer, and a third light transmissive medium layer characterized by an index of refraction $n_{2-3}$, where $n_{2-3} < n_{1-3}$, disposed between the third light concentrating layer and the third light transport layer; and, an inner portion consisting of a plane parallel region of the third light transport layer having a respective side-end primary light exit surface, wherein the inner portion is disposed adjacent underneath the second light transport layer; and a light transmissive medium layer characterized by an index of refraction $n'_{2-3}$, where $n'_{2-3} \geq n_{2-3}$ and $< n_{1-3}$, disposed immediately adjacent a top surface of the plane parallel region of the third light transport layer.

The optional secondary light concentrator serves to collect the light propagating in the low-aspect-ratio transport structure and further concentrate it for out-coupling through the exit-end of the transport structure and into a receiver such as a PV cell disposed to receive the out-coupled light. According to a non-limiting aspect, a light concentrating optical component may be operatively coupled to (e.g., molded to, cemented to, free-space-aligned to, etc.) the exit-end of the transport structure to secondarily concentrate and out-couple the light into a PV cell. The optical component may be made of the same or a different material than the transport structure suitable to perform its intended function. Alternatively, the exit-end itself of the transport structure may be shaped (e.g., parabolically-tapered; straight-tapered; trapezoidally-tapered; or, otherwise appropriately shaped) to integrally form the secondary concentrator in the exit-end of the transport structure. Such shapes will support TIR and/or specular and/or diffuse reflection of the light propagating in the transport structure.

According to various aspects, any of the system embodiments disclosed above may be in the form of an azimuthal (pie-shaped) section of a rotationally symmetric, 360° annular disk-shaped system, where the exit face(s) of the system is at the annular, vertex region of the section or at the inner side of the rotationally symmetric annular disk. If the outer side edge of a pie-shaped section of the system is made straight such that each section now resembles generally a triangle (with a truncated vertex) in plan view, multiple system sections can be interleaved side-by-side to create a straight row-shaped system. Alternatively, two or more sections disposed side-by-side will form a curved system format up to and including a full 360° disk format.

For a rotationally symmetric, 360° annular disk-shaped system format, the output light at the inner annulus, side end surface(s) of the system may be turned substantially 90° (into −y direction) from the light transport direction (+z direction) either before or during secondary concentration, depending upon the shape and optical surface characteristics of the secondary light concentrator.

In various aspects of a light collection and concentration system as embodied herein, a non-optical surface of the primary light concentrator component as well as a non-faceted surface of the light transport structure may be co-tilted such that the resulting overall longitudinal aspect of the system is, e.g., planar rather than wedge-like and, in any case, reduced in volume.

Additional features and advantages of the invention will be set forth in the detailed description which follows, and in part will be readily apparent to those skilled in the art from that description or recognized by practicing the invention as described herein, including the claims as well as the appended drawings.

It is to be understood that both the foregoing general description and the following detailed description are merely exemplary of the invention, and are intended to provide an overview or framework for understanding the nature and character of the invention as it is claimed. The accompanying drawings are included to provide a further understanding of the invention and are incorporated in and constitute a part of this specification. The drawings illustrate various embodiments of the invention and together with the description serve to explain the principles and operation of the invention.

BRIEF DESCRIPTION OF THE DRAWINGS

FIGS. 5A-5E show various illustrative aspects of primary light concentrator configurations according to alternative illustrative aspects of the invention;

FIGS. 9A, 9B show a schematic cross sectional view of a primary light concentrator unit in the form of a catadioptric system according to an exemplary aspect of the invention;

FIGS. 18A, 18B show perspective views of alternative, shaped, secondary light concentrators in the form of a parabolic concentrator and a straight-trapezoidal concentrator, respectively, according to non-limiting, illustrative embodiments of the invention;

FIG. 19D is a partial schematic, cross sectional view presented to aid in the explanation of Table I;

DETAILED DESCRIPTION OF EMBODIMENTS OF THE INVENTION

Figure 3:
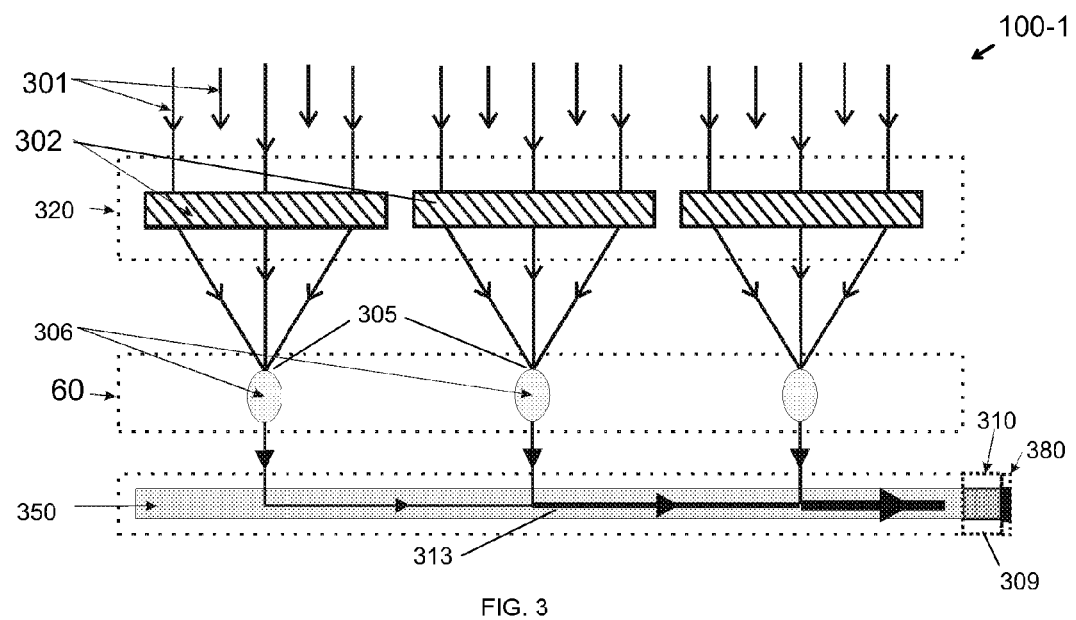
FIG. 3 is a cross sectional schematic view of a light collection and concentration system according to an illustrative embodiment of the invention.

FIG. 3 schematically shows a cross sectional portion of a light collection and concentration unit-system 100-1 according to an illustrative embodiment of the invention that provides a general overview of the system components, system configuration, and system operation. As illustrated, solar radiation (light) 301 is incident upon primary light concentrators $302_n$. Through refraction, reflection, or diffraction as determined by the nature of the primary light concentrators, the light 301 is concentrated at respective regions $305_n$, shown as focal spots in a focal plane. Respective light directing structures $306_n$ intercept the focal spots of light and provide a means for injecting the light into a unit-system's single transport structure 350 and directing it to propagate within the transport structure in the direction of arrows 313. As shown by the increasing boldness of the arrows 313 in the propagation direction, the light intensity propagating towards the right in FIG. 3 increases cumulatively due to the injected light from the plurality of primary light concentrators and respective light directing structures. The transport structure 350 has an exit-end designated at 309 where the propagating light would exit the transport structure. An optional secondary light concentrator 310 is shown directly coupled to the exit-end of the transport structure and serves to further concentrate the light out-coupled from the transport structure through an exit-end of the secondary concentrator, which has a reduced surface area, advantageously sized to match the entrance aperture of a photo-voltaic (PV) cell. A PV cell 380 is shown disposed at the exit-end of the secondary concentrator to directly receive the further concentrated, out-coupled light.

Figure 1:
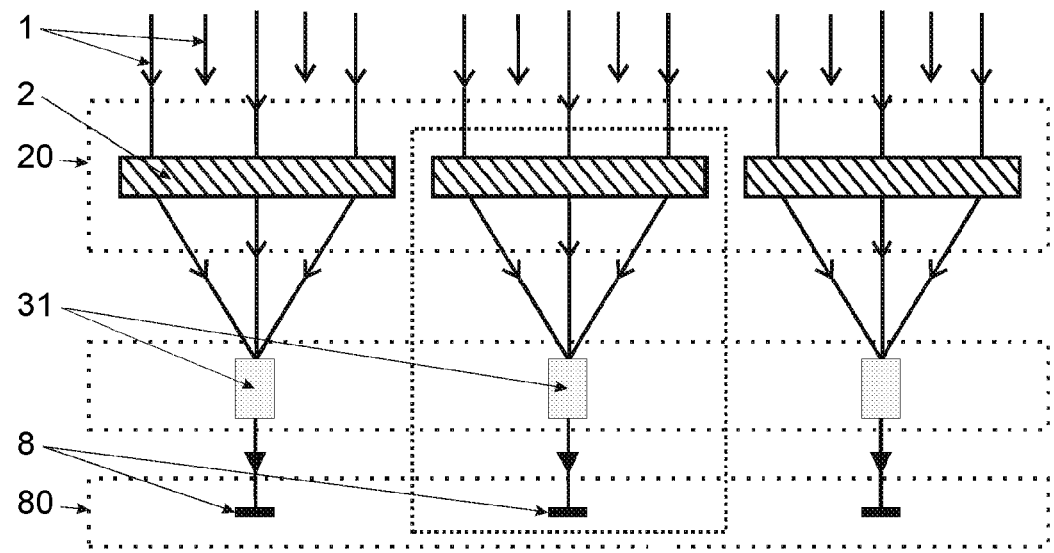
FIG. 1 is a cross sectional schematic view of a generic prior art solar energy system.
Figure 2:
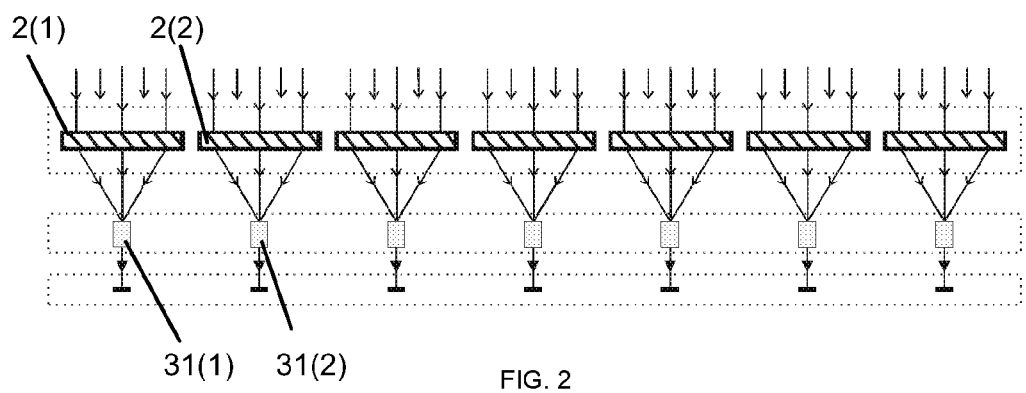
FIG. 2 is a cross sectional schematic view of a more compact generic prior art solar energy system similar to that illustrated in FIG. 1.
Figure 4:
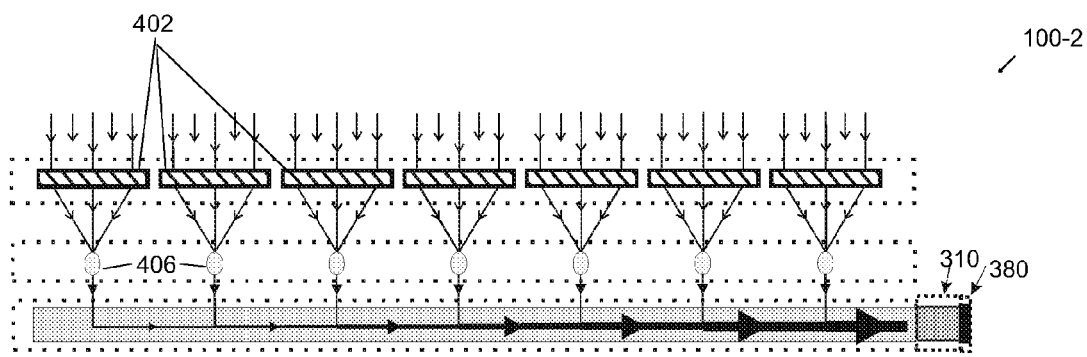
FIG. 4 is a cross sectional schematic view of a more compact light collection and concentration system similar to that illustrated in FIG. 3 according to an illustrative embodiment of the invention.

FIG. 4 schematically shows a cross sectional portion of a light collection and concentration unit-system 100-2 according to an illustrative embodiment of the invention that is similar to that of 100-1 in FIG. 1, except that the number and size of the primary light concentrators $402_n$ have increased and decreased, respectively, and the number of light directing structures $406_n$ has increased to match that of each respective primary concentrator, resulting in a more compact (at least thinner) system than that shown in FIG. 3. Note, again, that each unit-system has only a single, respective light transport structure and a single PV cell.

What follows is a descriptions of the various components and component systems suitable for use in the embodied invention according to non-limiting aspects of the invention.

Primary Light Concentrator

The primary light concentrator has two major functions: to collect incident solar radiation; and, to concentrate the incident radiation into a desired spot size at a desired concentration location coincident with a respective light directing structure. Thus the primary light concentrator will be characterized by, among other things, a focusing power parameter. Hereinafter, the concentrated light spot will be referred to as the focus spot and the concentration location will be referred to as the focal plane, for each primary light concentrator, although this terminology is not intended to limit the light concentration to the optical focus per se of a primary light concentrator.

According to an embodiment, the primary light concentrator is a refractive component; i.e., a lens of various types well known in the art. Based on system design parameters, the refractive component can be provided in a suitable material having desired physical and optical characteristics including, but not limited to, index of refraction, size, shape, curvature, conic constant, orientation, geometry, and so on.

It will be further appreciated that a light collection and concentration unit-system according to various non-limiting aspects of the invention will comprise a plurality of primary light concentrators arranged discretely in, e.g., a non-overlapping array, as a group of interconnected individual lenses arranged, e.g., in a non-overlapping array of groups, as an annular or other sequential interconnection of lenses, and other configurations.

Figure 5B:
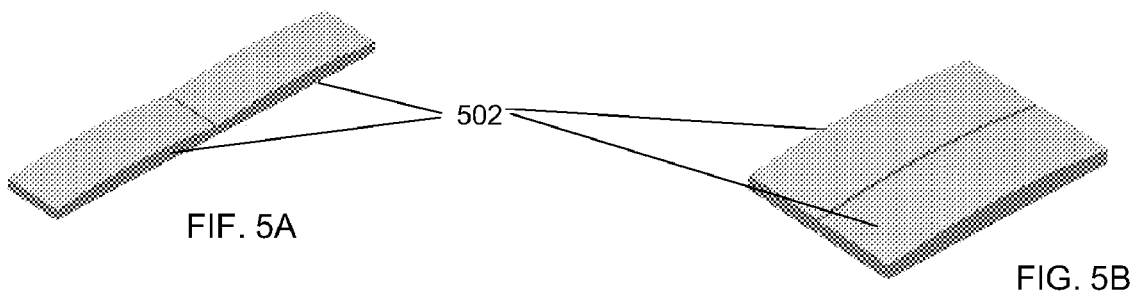
Figure 5C:
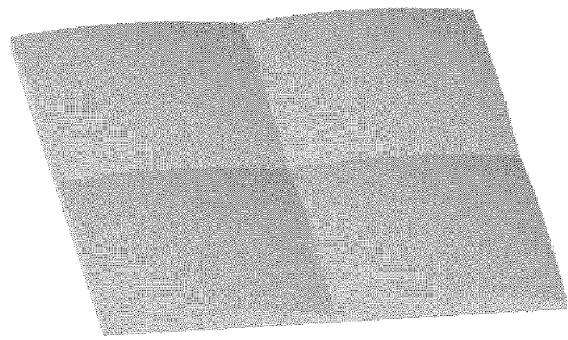
Figure 5D:
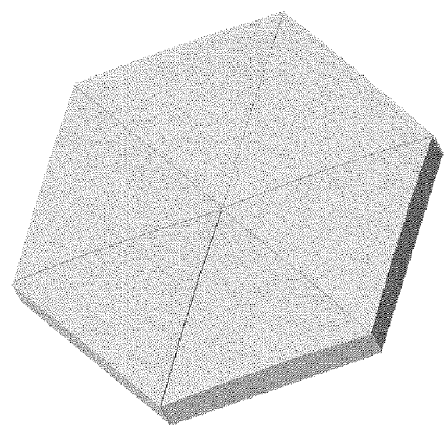
Figure 5E:
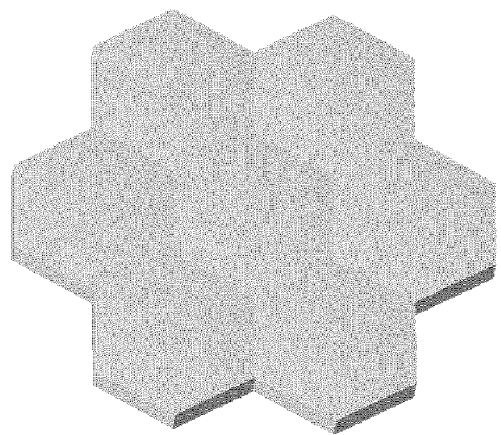

According to an illustrative aspect, the primary light concentrator 502 is a rectangular shaped cylindrical lens, as shown for illustration as two connected end-to-end and side-by-side lenses, respectively, in FIGS. 5A, 5B. Each lens may, for example, have a clear aperture of 1 mm×3 mm and an aspheric surface contour. A primary light concentrator unit according to this illustrative aspect would have straight-lined foci as opposed, for example, to a circular or arc-shaped focal spot. FIGS. 5C, 5D, 5E illustrate alternate primary light concentrator lens shapes and array shapes using square lenses, triangular lenses, and hexagonal lenses, respectively. It will be appreciated that a primary light concentrator unit need not be limited to these lens or array shapes as discussed below.

Figure 6:
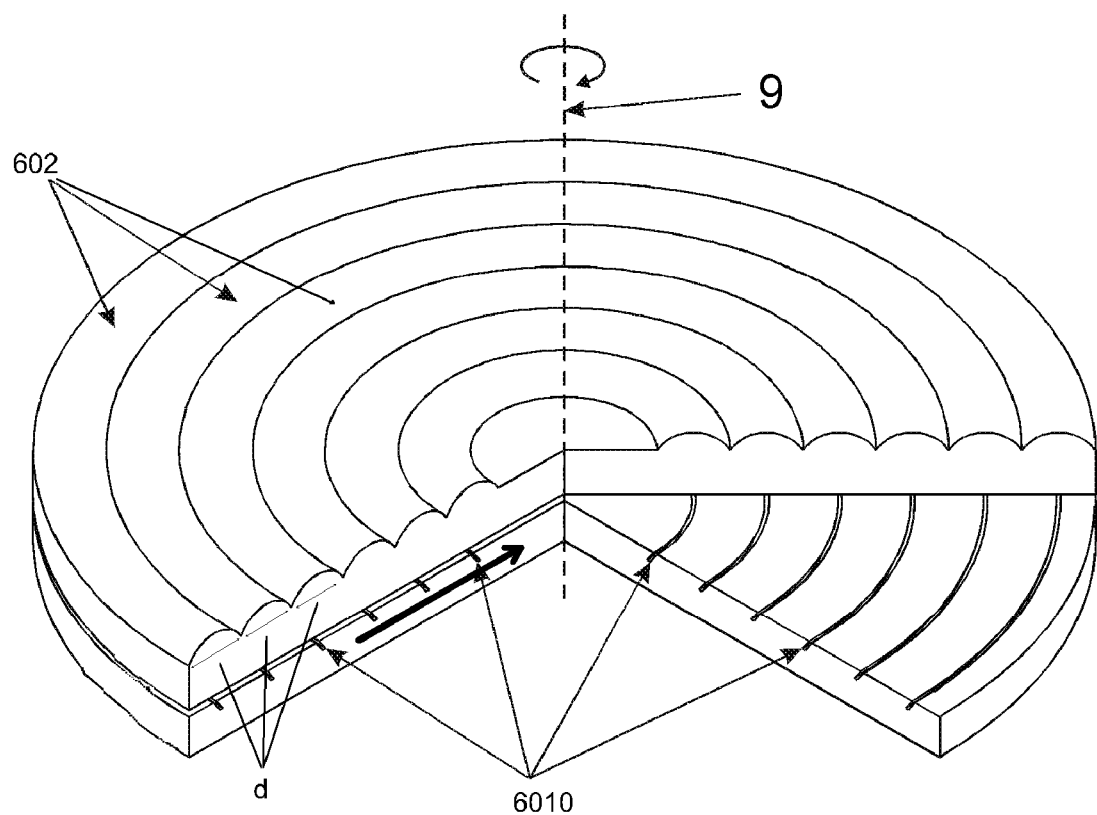
FIGS. 6A, 6B show different views of an annular-circular primary light concentrator component of the system according to an illustrative aspect of the invention.
Figure 6:
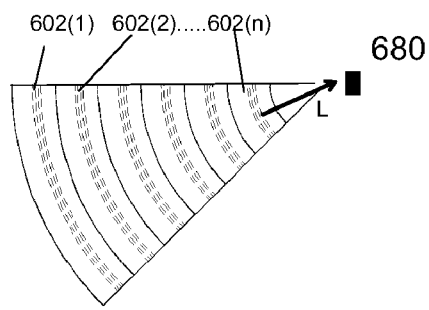

In another illustrative aspect, each primary light concentrator $602_n$ is a circular cylindrical lens or arc section thereof, as illustrated in FIGS. 6A, 6B. As shown, a plurality of lenses $602_n$ are interconnected in an annular (radial) manner. Each lens 602 has a diameter, d, that may or may not be constant. As further illustrated in FIG. 6A, each lens 602 has a cross sectional profile extending over a full arc of 180 degrees. Also, as shown, all of the lenses $602_n$ have the same f/#. However, the profile and/or f/# may vary among the lenses, as described below in conjunction with FIG. 7. According to the illustrative system embodiment of FIG. 6, the collected input light will ultimately be propagated in an inward radial direction (bold arrow L) to a PV cell 680 located at the radial origin of each unit system. Thus the unit shape may be a geometrical arc from a few degrees, shown in the form of a pie-shaped slice in FIG. 6B, potentially up to a full 360 degrees depending upon the entrance aperture of the PV cell associated with each unit-system.

Figure 7:
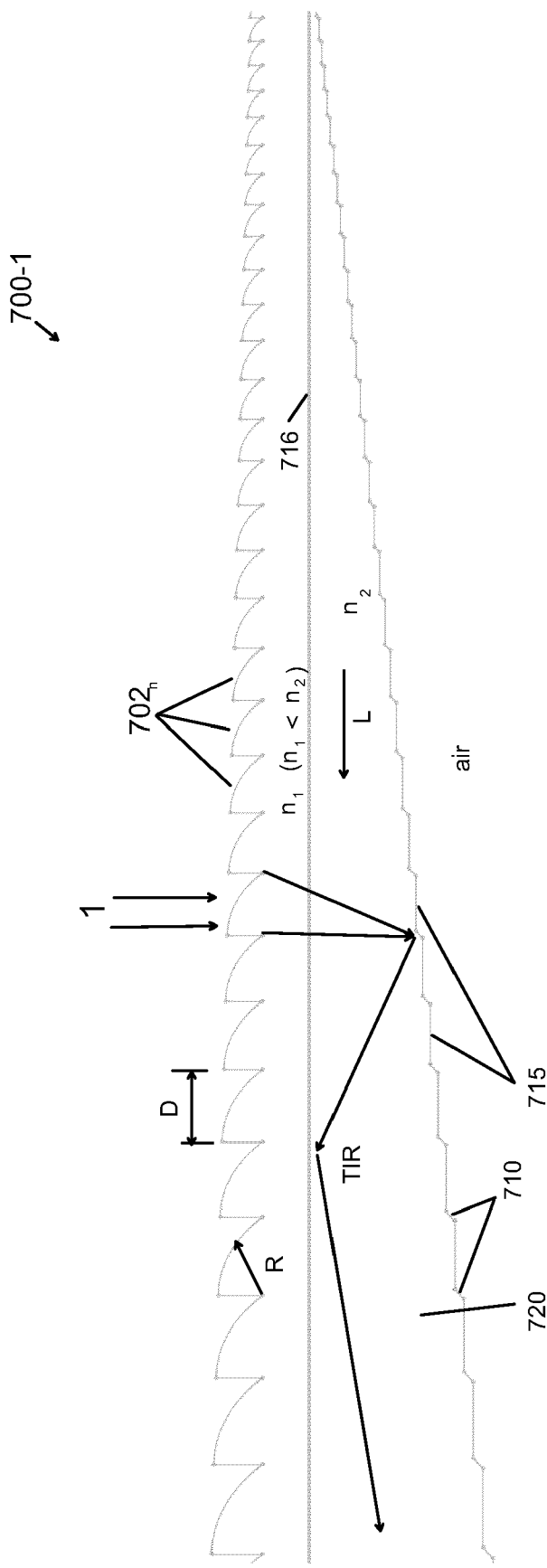
FIG. 7 shows a schematic cross sectional view of a primary light concentrator component according to an exemplary aspect of the invention.

FIG. 7 shows in cross sectional profile a non-limiting, illustrative aspect of a light collection and concentration system including a plurality of primary light collectors $702_n$ and a light transport structure 720 of index $n_2$ with integrally incorporated light directing structures 710. Each of the lenses $702_n$ has a curved saw tooth cross sectional profile having a variable radial extent R from zero degrees (i.e., R horizontal) to 90 degrees (R vertical) or less. Although the f/#s remain equal in this example, the clear apertures, D, of the lenses increase monotonically from the largest annulus (right end of diagram) to the smallest annulus (left end of diagram). The light directing structures 710 are formed in the bottom surface 715 of the light transport structure 720, forming a stepped-surface as shown. The top surface 716 of the light transport structure is flat and represents the high/low index boundary ($n_1 \leq n_2$) to support TIR within the transport structure. In a prototype design, the lens' clear apertures ranged from about 0.5 mm to about 7 mm. The size of the light directing structures was optimized to be between 0.05 mm×0.05 mm to 1 mm×1 mm. The angle of the light directing structures was optimized to be between 41° to 45°. The cone angle of light from the primary concentrators incident on the light directing structures was optimized to be between 20° to 23°. Light is propagated within the light transport structure in the direction L.

Figure 8:
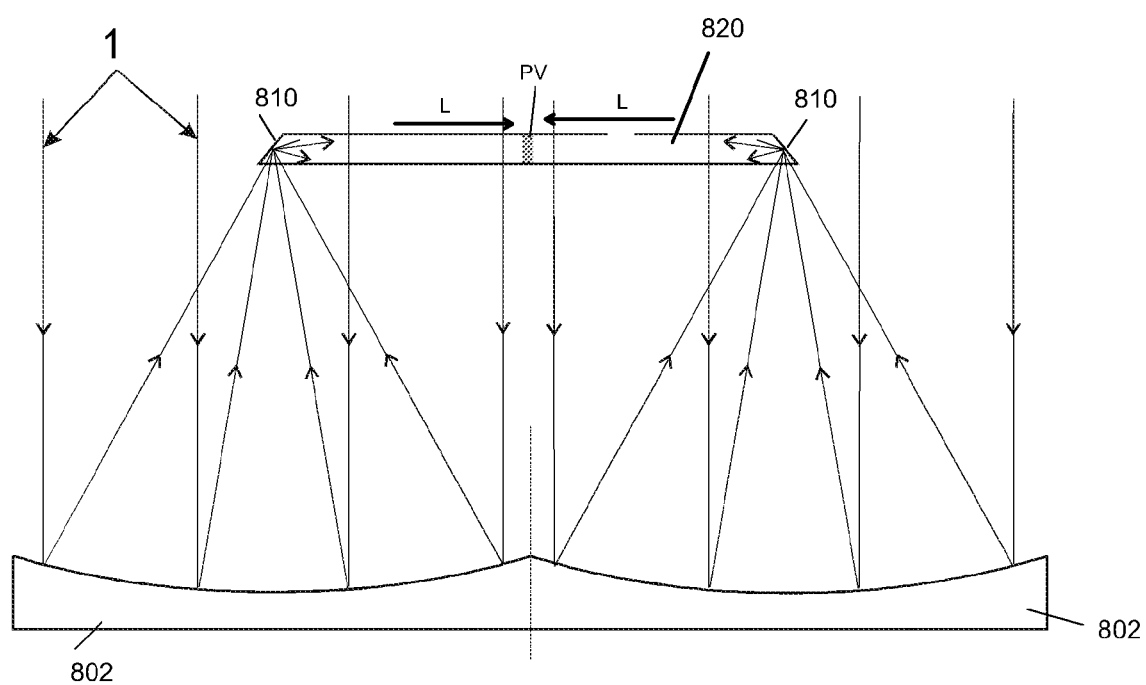
FIG. 8 shows a schematic cross sectional view of a reflective-type system according to an exemplary aspect of the invention.

According to another embodiment, the primary light concentrator is a reflective component; i.e., a mirror of various types well known in the art. A cross sectional view of an illustrative reflective-type system is shown in FIG. 8 where reference numeral 802 represents a reflective primary light concentrator. Incident sunlight 1 is collected by the primary concentrator and is focused onto a light directing structure 810 in a transport structure 820. The concentrated light is totally internally reflected, or otherwise reflected, in the direction of arrows L towards the center of the unit where a PV cell is located. It will be appreciated by those skilled in the art that the geometries of reflective primary light concentrator units may be similar to those of the refractive type described above, in accordance with the intended functions of the primary light concentrators.

According to an alternative aspect, the primary light concentrator unit may comprise a catadioptric system as grossly illustrated in FIGS. 9A, 9B. Solar radiation 1 is incident on a refractive component 932 and thereafter propagates in a semi-concentrated state to a reflective component 934 before being focused onto a respective light directing structure in transport structure 920.

Light Directing Structure and Light Transport Structure

According to an embodiment of the invention, the light directing structure and light transport structure form an integral component. As discussed above, the function of the light directing structure is to receive the focal spot (which is propagating in one direction) from the primary light concentrator and direct that light into the transport structure so that it may propagate within the transport structure in a direction generally transverse to that of the incident light direction.

Figure 10:
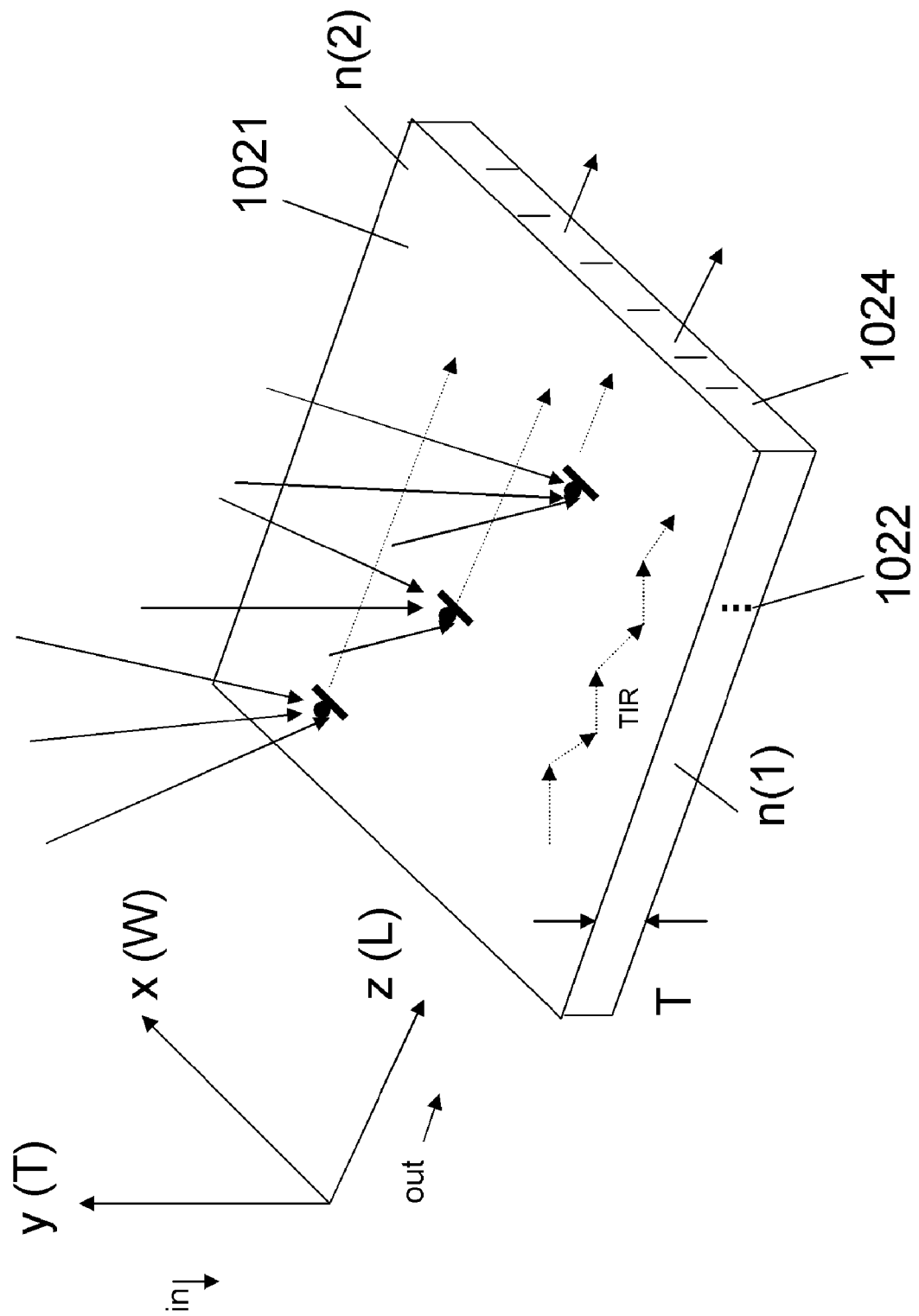
FIG. 10 shows a schematic perspective view of a generic light transport structure for illustration purposes.

A generic, sheet-type light transport structure 1050 according to the embodiments of the invention is shown in a schematic perspective view in FIG. 10. The structure has general dimensions of width (W), length (L) and thickness (T) as labeled in the accompanying x-y-z coordinate system. The light transport structure has a low aspect ratio defined by T/L. In an exemplary design, T is on the order of three to five mm and L is between about 300 mm-500 mm. The width (W) may vary depending upon the overall system geometry (e.g., rectangular, circular, pie-shaped, etc.). The light transport structure has a top surface portion 1021 and a bottom surface portion 1022 separated by the thickness (T), and an exit-end 1024 where the light exits the light transport structure as indicated by the solid arrows. The light transport structure, in essence an optical waveguide, advantageously has a higher index of refraction $n_1$ within the structure and a lower or equal index of refraction $n_2$ at the top and bottom surface portions or immediately adjacent thereto such that light is principally propagated within the structure via total internal reflection (TIR) as represented by the dotted arrows. Portions of the appropriate top and/or bottom surfaces may also have a reflective coating to aid in the propagation of residual light that is not totally internally reflected.

Figure 11:
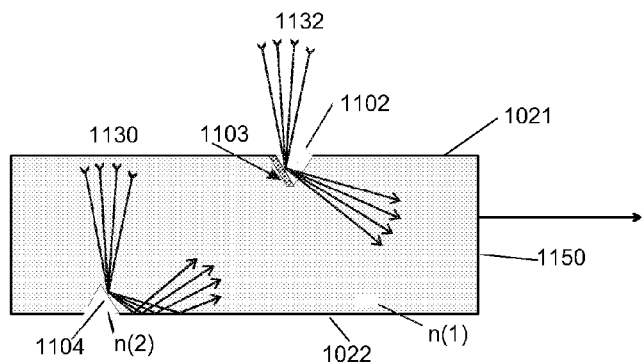
FIG. 11 schematically shows in cross section a light transport structure incorporating two light directing structures according to an illustrative aspect of the invention.

FIG. 11 schematically shows in cross section an illustrative light transport structure 1150 incorporating two illustrative light directing structures 1102, 1104. Light directing structure 1104 is a surface of the light transport structure made by a partial transverse lateral cut extending from a region of bottom surface portion 1022. For light directing structure 1104, focusing radiation 1130 from a primary concentrator (not shown) associated with light directing structure 1104 is intercepted at its focal point by the light directing structure 1104. Depending upon the angle orientation of the light directing structure 1104, focused radiation is primarily totally internally reflected from surface 1104 since the notched area behind the surface has an index $n_2$ (e.g., air) less than or equal to the index $n_1$ of the light transport structure (e.g., PMMA). Alternatively or in addition, similar light directing structure 1102 is a surface of the light transport structure made by a partial transverse lateral cut extending from a region of top surface portion 1021. For light directing structure 1102, focusing radiation 1132 from a primary concentrator (not shown) associated with light directing structure 1102 is intercepted at its focal point by the light directing structure 1102. Shaded area 1103 represents a reflective coating on surface 1102 that reflects the incident focused light 1132 into the structure for subsequent TIR propagation towards the exit-end of the structure. The exact angular orientation of the light directing structures will depend upon the nature of the reflection process, the lens' f/#s, and the transport structure index of refraction $n_2$. The notched region behind the light directing structure 1104 may, for example, be filled with a lower index dielectric material to facilitate TIR into the light transport structure.

Figure 12:
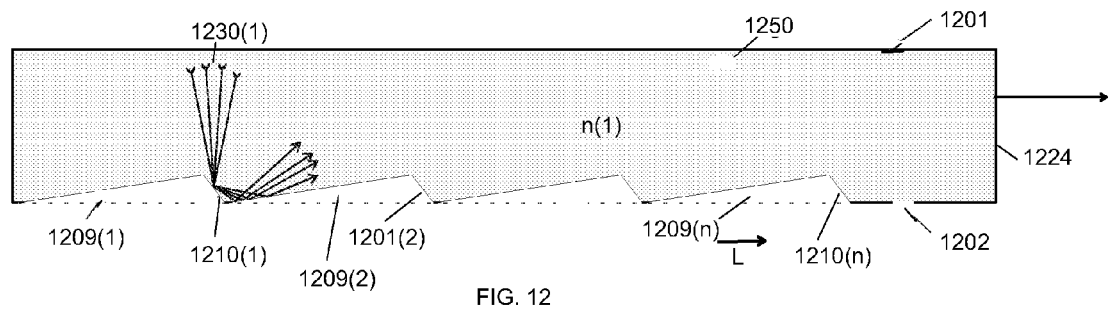
FIG. 12 schematically shows in cross section an alternative light transport structure and integrated light directing structures according to an illustrative aspect of the invention.
Figure 13:
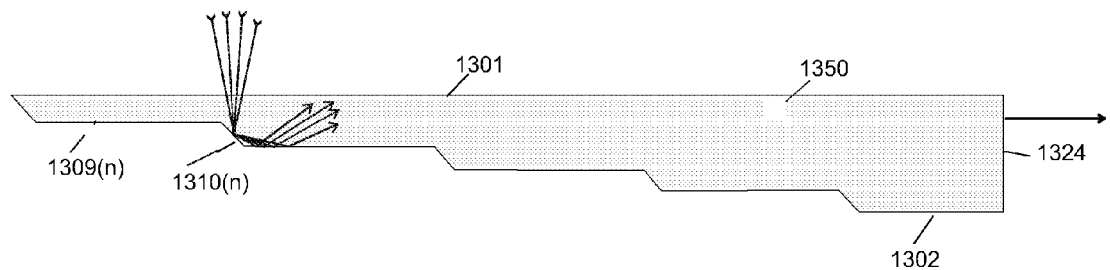
FIG. 13 schematically shows in cross section an alternative light transport structure and integrated light directing structures according to an illustrative aspect of the invention.
Figure 14:
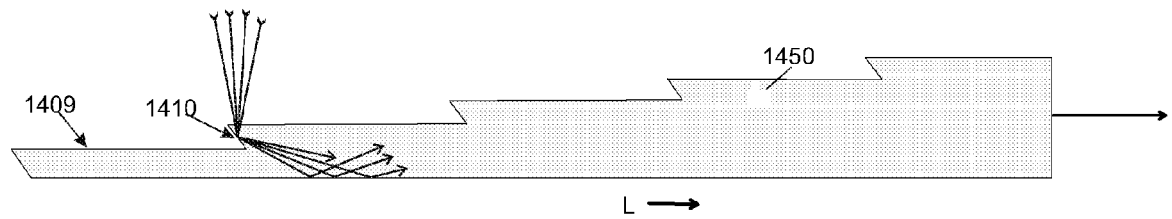
FIG. 14 schematically shows in cross section an alternative light transport structure and integrated light directing structures according to an illustrative aspect of the invention.

FIGS. 12-14 illustrate alternative aspects of the light transport structure and integrated light directing structures. In each case, the light transport structure has an index of refraction $n_2>1$ and is surrounded by air with index $n_1=1$.

In FIG. 12, light transport structure 1250 is shown having a planar top surface 1201 and an echelon-type bottom surface 1202; that is, the bottom surface includes a plurality of light directing structures $1210_n$ similar to those described and labeled 1104 in FIG. 11. The bottom surface portions $1209_n$ leading up to each light directing structure are straight ramps. Focused light $1230_1$ coming from a respective primary light concentrator (not shown) associated with light directing structure $1210_1$ primarily totally internally reflects off of surface $1210_1$ onto ramp portion $1209_2$ from which it is further primarily totally internally reflected and still further primarily totally internally reflected as it propagates in direction L towards exit-end 1224 where it will be output.

FIG. 13 schematically shows in cross section a stepped-surface light transport structure 1350 that is similar to light transport structure 1250 except that the bottom surface portions $1309_n$ preceding each respective light directing structure $1310_n$ are parallel to top surface portion 1301 and, the width of the light transport structure increases at each step by the height of each respective light directing structure as shown.

FIG. 14 shows another alternative design for the light transport structure and light directing structures. In this case, top surface portion 1401 is stepped parallel to continuously planar bottom surface portion 1402. It will be appreciated that the transport structures shown in cross section in FIGS. 11-14 may, for example, be extruded and thus have a straight width dimension or may be curved, for example, to follow the shape of the primary light concentrators (e.g., annular/cylindrical).

Figure 15:
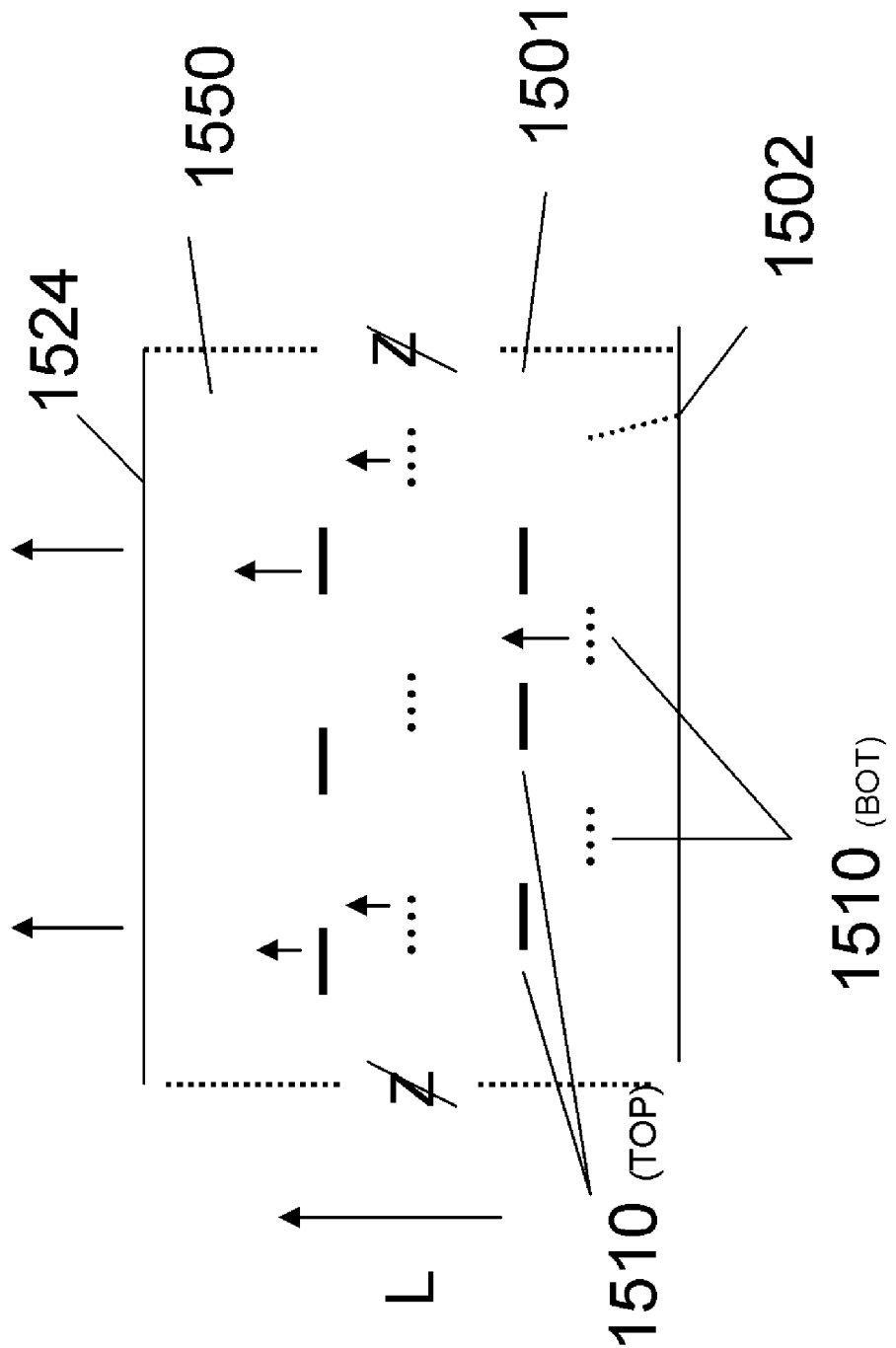
FIG. 15 is a schematic top plan view of a light transport structure with discrete light directing structures according to an illustrative aspect of the invention.

FIG. 15 is a schematic top plan view of a light transport structure 1550 with discrete light directing structures $1510_{TOP}$ extending from the top surface portion 1501 and light directing structures $1510_{BOT}$ extending from the bottom surface portion 1502.

Figure 16:
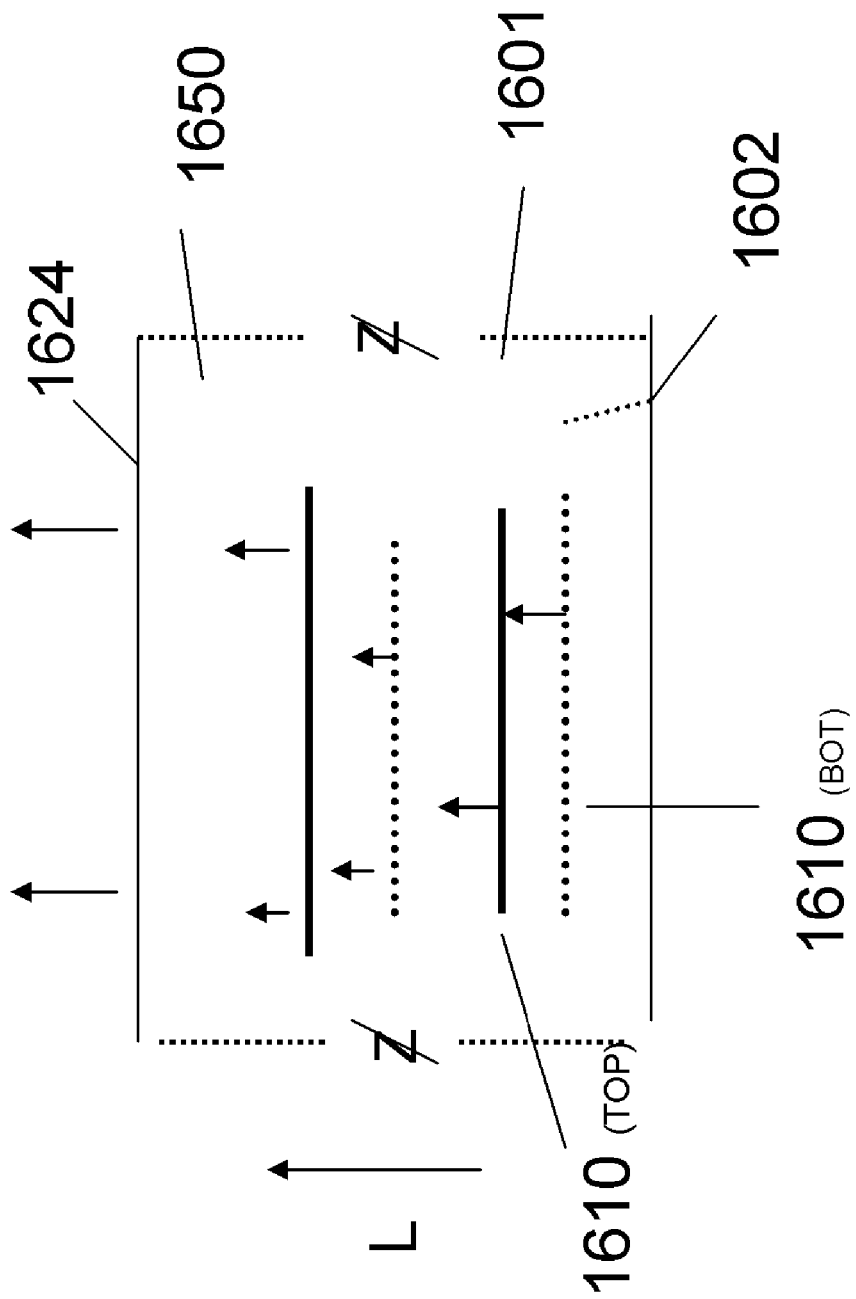
FIG. 16 is a schematic top plan view of a light transport structure with continuous light directing structures according to an illustrative aspect of the invention.
Figure 17:
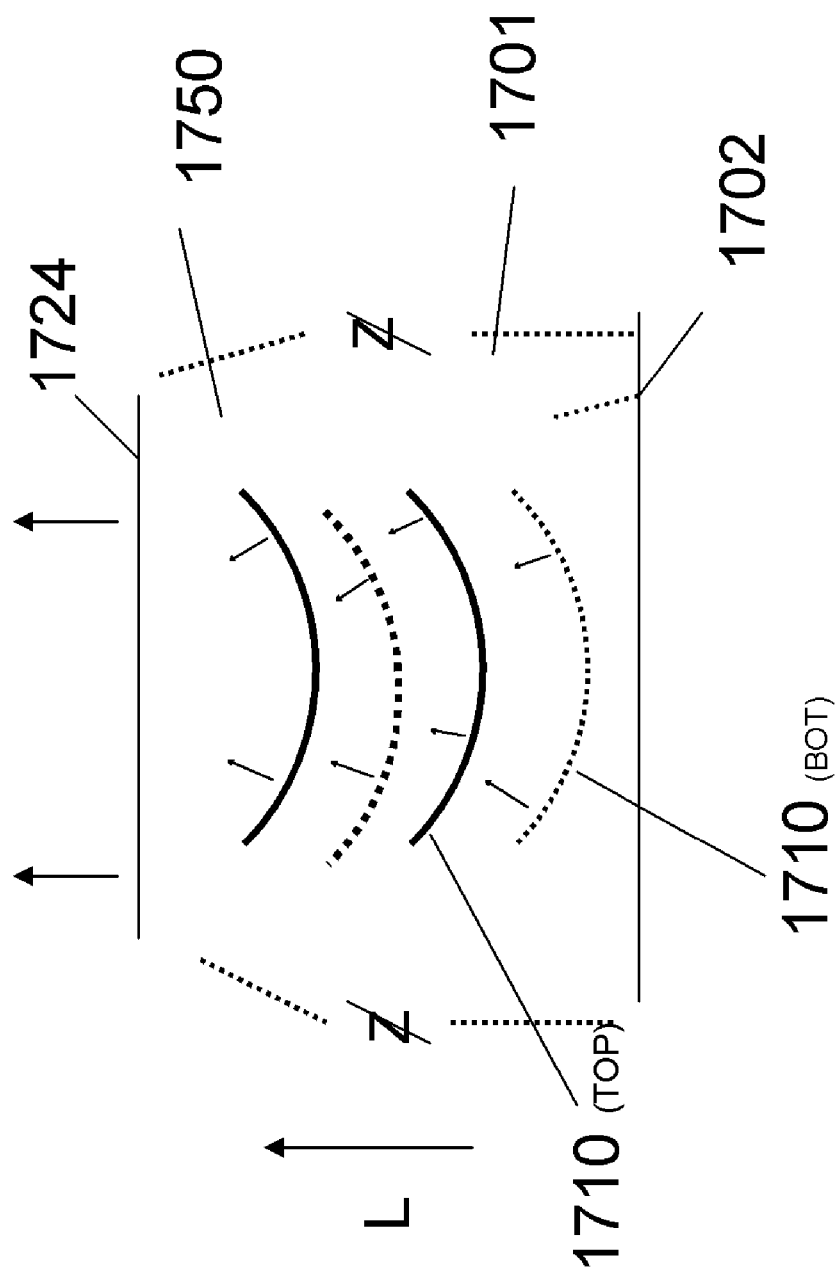
FIG. 17 is a schematic top plan view of a light transport structure with continuous light directing structures according to an illustrative aspect of the invention.

FIGS. 16 and 17, respectively, illustrate alternative light transport structures 1650, 1750 having individually continuous top and bottom light directing structures 1610$_{TOP}$, 1610$_{BOT}$ and 1710$_{TOP}$, 1710$_{BOT}$, which depend upon the geometry of each of their respective primary light concentrators (not shown).

The width of the focused light spots on their respective light directing structures will depend, in part, upon the thickness of the system. The thickness may influence the dimensions of the light directing structures. Thus, for example, if the tilted reflecting surface of a light directing structure is between about 130 μm-140 μm with a base dimension of about 130 μm and a height dimension of about 140 μm, then the width of the focused light may advantageously be about 100 μm (i.e., 100 μm diameter; 100 μm×length of cylindrical primary concentrator, etc.). These dimensions provide certain room for alignment error between the primary concentrator focus direction and the location of each respective light directing structure. A more detailed numerical example will be described below.

Due to the stringent and challenging alignment requirements, the primary concentrator surfaces and the light directing structures may advantageously be manufactured as an integrated unit to alleviate or minimize misalignment therebetween.

Alternative contemplated embodiments of the light transport structure may include light directing structures that are wholly embedded within the light transport structure. Examples of such light transport structure may include prisms, gratings, quantum dots, photonic crystals, and other structures that would be able to provide the required function of the light directing structures with or without primary focusing elements.

Secondary Light Concentrator

As described above, the light propagated in the light transport structure is out-coupled at the exit-end of the light transport structure as shown, e.g., at 1024 in FIG. 10. While the thickness, T, of the light transport structure may be on the order of 3 mm-5 mm in an exemplary aspect, the width, W, of the light transport structure (see FIG. 10) need not be constrained except that the structure is intended to cumulatively concentrate all of the light input to the light transport structure at the exit-end for ultimate input to a PV cell, as schematically illustrated in FIGS. 3 and 4. The limited entrance aperture of a PV cell located adjacent (advantageously, immediately adjacent) the exit-end of the transport structure may benefit from further concentration of the propagating light, in which case a secondary concentrator between the exit-end of the transport structure and the PV cell will be advantageous.

FIGS. 18A, 18B schematically illustrate two, exemplary, differently shaped secondary concentrators 1800-1, 1800-2 in the form of a parabolic concentrator and a straight-trapezoidal concentrator, respectively. As shown, for example, in FIG. 18A, a primary concentrator section 1802 has a plurality of primary light concentrators, which focus incident light 1 into a single light transport structure 1804 having a respective plurality of light directing structures (not shown). The light is propagated in the transport structure in the direction L by TIR. A separate compound parabolic secondary concentrator 1800-1 is shown directly coupled (e.g., cemented) to the exit-end of the transport structure, whereupon the surface 1801 of the secondary concentrator becomes the ultimate exit-end of the transport structure. Rather than being a separate component, the secondary concentrator 1800-1 (1800-2) may be an integral end of an extruded or molded light transport structure in the shape of a compound parabola (1800-1) or straight trapezoid (1800-2), for example (other appropriate shapes are not excluded). Depending upon the design of the secondary light concentrator, propagating light may continue to be totally internally reflected until out-coupled or, may be otherwise reflected until out-coupled. Accordingly, the secondary concentrator may be of the same or a different material than the transport structure; may be solid, hollow, gas-filled, or otherwise constructed as appropriate to perform its intended function.

Figure 19:
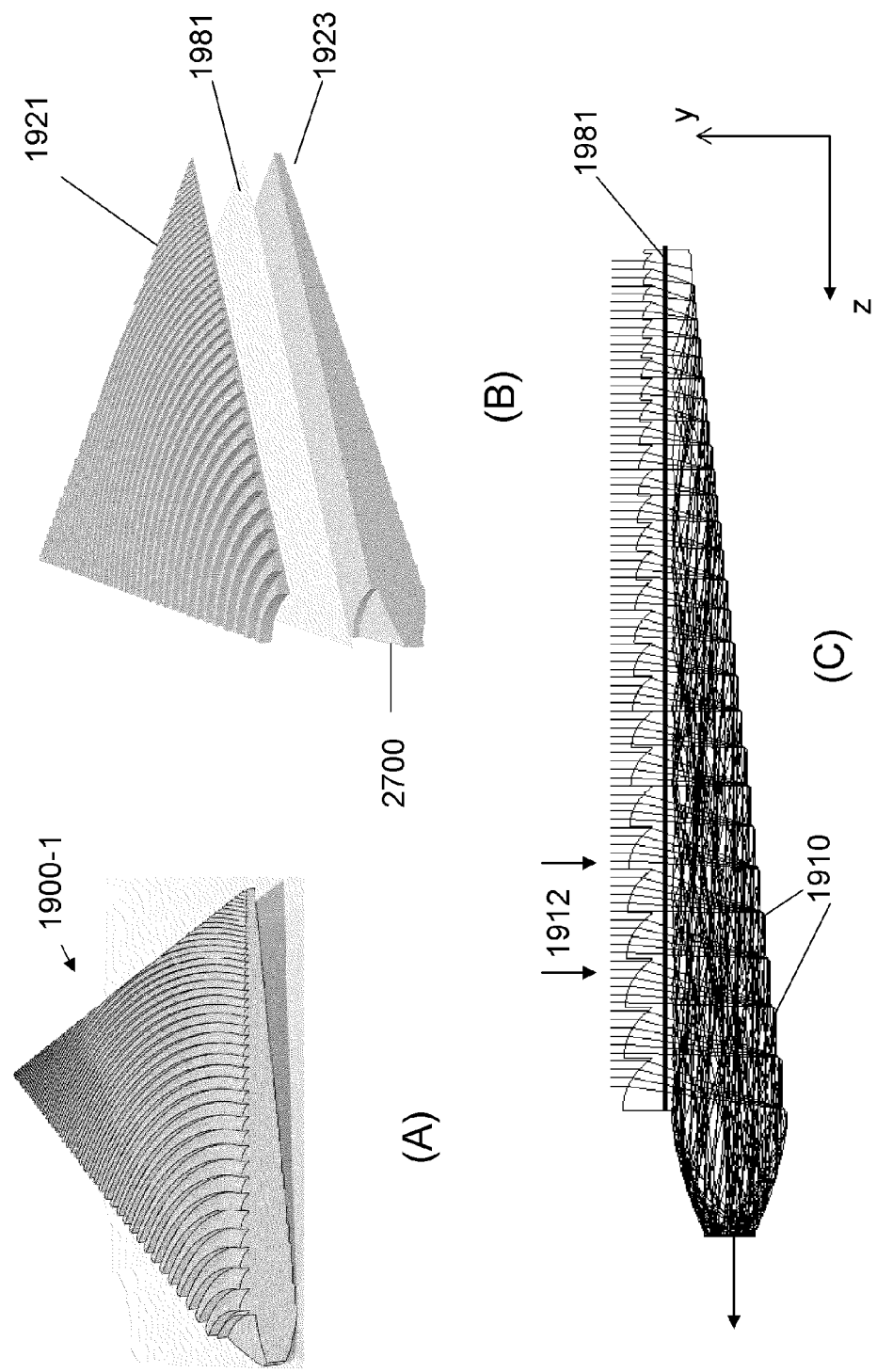
FIGS. 19(A, B, C) show various views of a pie-shaped, simple light collection and concentration system, according to exemplary aspects of the invention.

FIGS. 19A, 19B, and 19C, respectively, illustrate a truncated pie-shaped, simple light collection and concentration system 1900-1, an exploded view thereof, and a side cross sectional view thereof, akin to the system shown in FIGS. 6B and 7. As illustrated, the system 1900-1 is shown with an exemplary secondary concentrator 2700 (see FIG. 25) coupled to the light exit face of the light transport layer 1923. The system 1900-1 is referred to herein as a 'simple' (as opposed to 'compound') system because it comprises a single primary concentrator layer 1921, a single light transport layer 1923 and a low index, light-transmissive medium layer 1981 sandwiched therebetween. As illustrated more specifically in FIG. 19C, the bottom surface of the light transport layer includes a plurality of light injection elements 1910. Incident solar radiation 1912 is concentrated by the lenslets of the primary concentrator layer 1921 onto respective injection facets 1910. The light is totally internally reflected therefrom in the (+z) direction whereupon a secondary concentrator can further focus the light into a PV cell (not shown). As shown most clearly in FIG. 19C, the primary concentrator layer is scaled to accommodate the stepped geometry of the transport layer, resulting in a system having a wedge-like profile similar to that as shown, e.g., in FIGS. 13 and 14.

Table I below lists some design parameters for a simple, wedged light collection and concentration system, with reference to FIG. 19D and according to a non-limiting, illustrative example (all dimensions in millimeters (mm)). R is the radius of curvature of the lens, cc is the conic constant, and width, T, and step are the dimensions as shown in FIG. 19D. The primary concentrator consists of 43 similar rings with refractive surface on the top and reflective step on the bottom. The refractive surface is convex with conic constant cc. The concentrator material is PMMA. As listed in Table I, #1 is outer-most concentrator ring, #43 is the inner-most concentrator ring.

TABLE I

| # | width | R | cc | T | step |
|---|-------|---|-----|---|------|
| 1 | 1 | 1.0179 | −0.448 | 3.0235 | 0.12 |
| 2 | 1.046 | 1.0646 | −0.448 | 3.1622 | 0.1255 |
| 3 | 1.094 | 1.1134 | −0.448 | 3.3072 | 0.1313 |
| 4 | 1.144 | 1.1645 | −0.448 | 3.4589 | 0.1373 |
| 5 | 1.196 | 1.2179 | −0.448 | 3.6175 | 0.1436 |
| 6 | 1.251 | 1.2737 | −0.448 | 3.7834 | 0.1502 |
| 7 | 1.309 | 1.3321 | −0.448 | 3.9569 | 0.157 |
| 8 | 1.369 | 1.3932 | −0.448 | 4.1384 | 0.1642 |
| 9 | 1.432 | 1.4571 | −0.448 | 4.3282 | 0.1718 |
| 10 | 1.497 | 1.524 | −0.448 | 4.5267 | 0.1797 |
| 11 | 1.566 | 1.5939 | −0.448 | 4.7343 | 0.1879 |
| 12 | 1.638 | 1.667 | −0.448 | 4.9514 | 0.1965 |
| 13 | 1.713 | 1.7434 | −0.448 | 5.1785 | 0.2055 |
| 14 | 1.791 | 1.8234 | −0.448 | 5.416 | 0.215 |
| 15 | 1.873 | 1.907 | −0.448 | 5.6644 | 0.2248 |
| 16 | 1.959 | 1.9944 | −0.448 | 5.9242 | 0.2351 |
| 17 | 2.049 | 2.0859 | −0.448 | 6.1958 | 0.2459 |
| 18 | 2.143 | 2.1816 | −0.448 | 6.48 | 0.2572 |
| 19 | 2.242 | 2.2816 | −0.448 | 6.7772 | 0.269 |
| 20 | 2.344 | 2.3863 | −0.448 | 7.088 | 0.2813 |
| 21 | 2.452 | 2.4957 | −0.448 | 7.4131 | 0.2942 |
| 22 | 2.564 | 2.6102 | −0.448 | 7.7531 | 0.3077 |
| 23 | 2.682 | 2.7299 | −0.448 | 8.1086 | 0.3218 |

TABLE I-continued

| # | width | R | cc | T | step |
|---|---|---|---|---|---|
| 24 | 2.805 | 2.8551 | −0.448 | 8.4805 | 0.3366 |
| 25 | 2.933 | 2.986 | −0.448 | 8.8694 | 0.352 |
| 26 | 3.068 | 3.123 | −0.448 | 9.2762 | 0.3682 |
| 27 | 3.209 | 3.2662 | −0.448 | 9.7016 | 0.385 |
| 28 | 3.356 | 3.416 | −0.448 | 10.1466 | 0.4027 |
| 29 | 3.51 | 3.5726 | −0.448 | 10.6119 | 0.4212 |
| 30 | 3.671 | 3.7365 | −0.448 | 11.0986 | 0.4405 |
| 31 | 3.839 | 3.9078 | −0.448 | 11.6076 | 0.4607 |
| 32 | 4.015 | 4.0871 | −0.448 | 12.14 | 0.4818 |
| 33 | 4.199 | 4.2745 | −0.448 | 12.6967 | 0.5039 |
| 34 | 4.392 | 4.4706 | −0.448 | 13.279 | 0.527 |
| 35 | 4.593 | 4.6756 | −0.448 | 13.888 | 0.5512 |
| 36 | 4.804 | 4.89 | −0.448 | 14.525 | 0.5765 |
| 37 | 5.024 | 5.1143 | −0.448 | 15.1911 | 0.6029 |
| 38 | 5.255 | 5.3488 | −0.448 | 15.8878 | 0.6306 |
| 39 | 5.496 | 5.5941 | −0.448 | 16.6164 | 0.6595 |
| 40 | 5.748 | 5.8507 | −0.448 | 17.3785 | 0.6897 |
| 41 | 6.011 | 6.119 | −0.448 | 18.1755 | 0.7214 |
| 42 | 6.287 | 6.3997 | −0.448 | 19.0091 | 0.7545 |
| 43 | 6.575 | 6.6932 | −0.448 | 19.8809 | 0.7891 |

Figure 20:
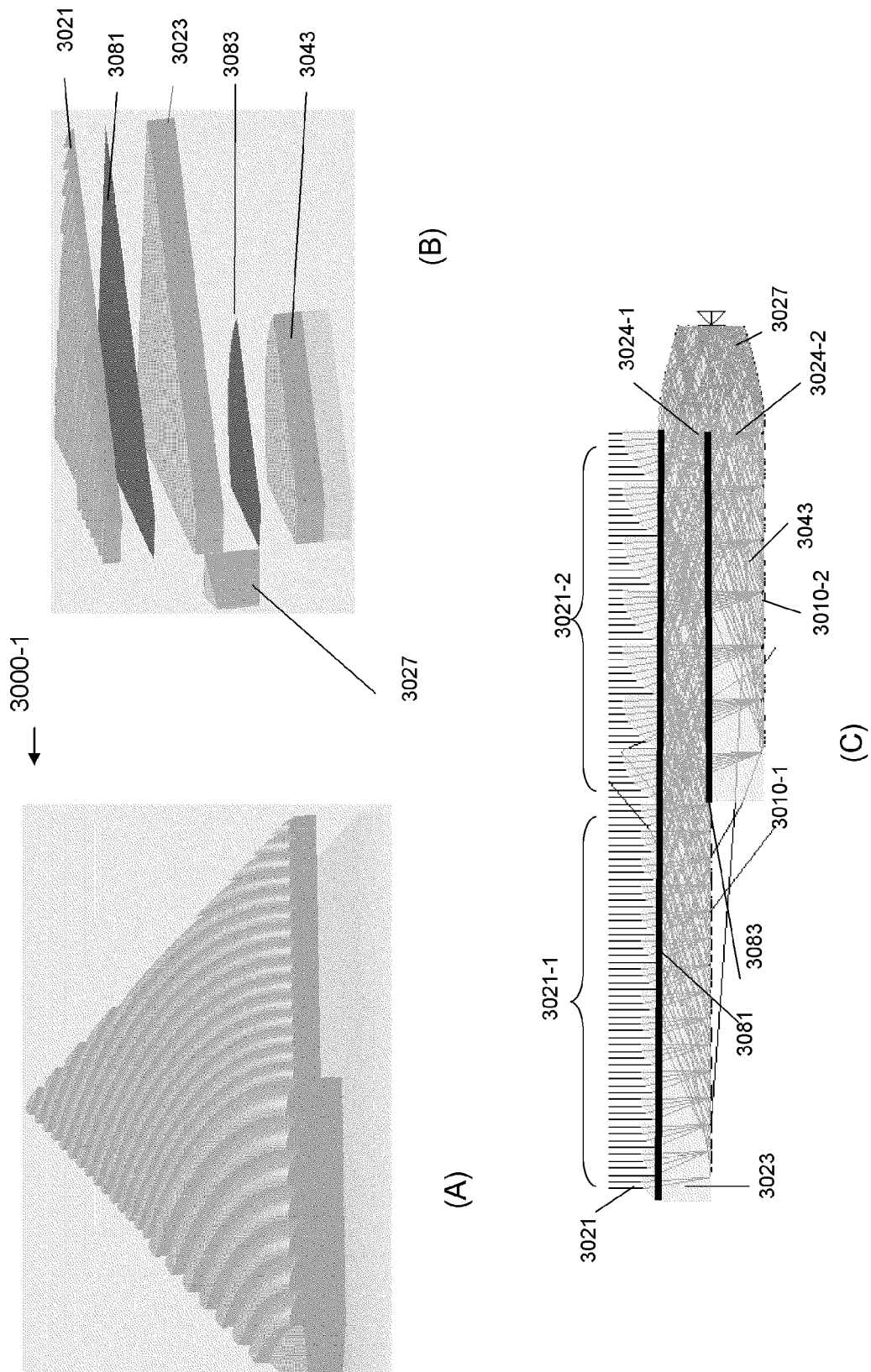
FIGS. 20(A, B, C) show, respectively, a perspective cad-cam view of an equi-depth light collection and concentration system according to an embodiment of the invention; an exploded view of the equi-depth light collection and concentration system illustrated in FIG. 20A; and, a schematic, cross sectional view of the equi-depth light collection and concentration system illustrated in FIG. 20A.

FIGS. 20(A-C) illustrate what is referred to herein as an 'equi-depth' light collection and concentration system 3000-1 according to an embodiment of the invention. The system includes a light concentrating layer 3021 having a first section 3021-1 and at least a second section 3021-2, a first light transport layer 3023 characterized by an index of refraction $n_{1-1}$, which includes a plurality of light directing elements 3010-1 disposed in at least a portion of one of the top and bottom surfaces thereof in optical registration with the first section 3021-1 of the light concentrating layer, and having a respective side-end primary light exit surface 3024-1. The system further includes a first light transmissive medium layer 3081 characterized by an index of refraction $n_{2-1}$, where $n_{2-1} < n_{1-1}$, disposed immediately adjacent the light concentrating layer 3021 and the first light transport layer 3023, at least a second light transport layer 3043 characterized by an index of refraction $n_{1-2}$, that includes a plurality of light directing elements 3010-2 disposed in at least one of the top and bottom surfaces thereof and in respective optical registration with the at least second section 3021-2 of the light concentrating layer 3021, and having a respective side-end primary light exit surface 3024-2. The system further includes a respective at least second light transmissive medium layer 3083 characterized by an index of refraction $n_{2-2}$, where $n_{2-2} < n_{1-2}$, disposed immediately adjacent the first light transport layer 3023 and the second light transport layer 3043.

Figure 25:
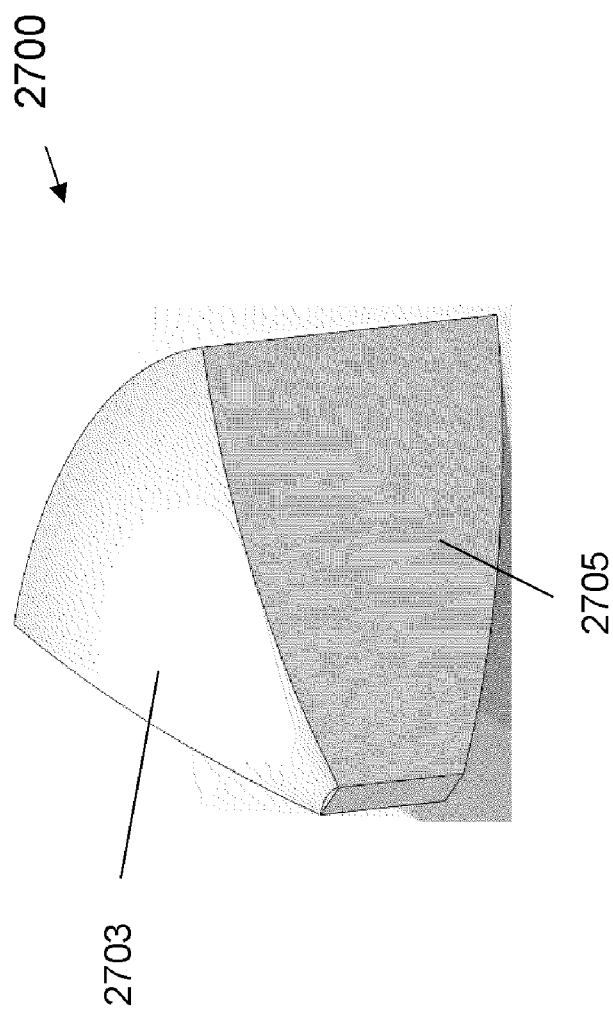
FIG. 25 is a perspective cad-cam view of a secondary concentrator according to an illustrative aspect of the invention.

As shown in FIGS. 20(A-C), a secondary light concentrator 3027 is optically coupled to the first and second side-end exit surfaces 3024-1, 3024-2. In an exemplary aspect, the secondary light concentrator 3027 has toroidal top and bottom surfaces 2703 and plano side surfaces 2705 as shown in FIG. 25. An optical cement or gel may be used to create optical contact between the light transport layers and the secondary concentrator to minimize Fresnel losses.

Table II below lists some design parameters for the primary concentrator and light transport layers of an 'equi-depth' light collection and concentration system according to a non-limiting, illustrative example, where * refers to the linear displacement along the collector radius from the center of the ring (all dimensions in mm).

TABLE II

|  |  | 1st ring (inner) | 2nd ring (outer) |
|---|---|---|---|
| Sector radius (mm) |  | 55 | 100 |
| Ring width* (mm) |  | 6 | 3 |
| Number of rings |  | 7 | 15 |
| Lens Focusing Element | Radius of Curvature | 5.189 | 2.594 |
|  | Conic constant | −0.4483 | −0.4483 |
|  | Center thickness (mm | 4.0 | 2.0 |
| Light Directing Structure | Width (mm) | 0.5 | 0.25 |
|  | Angle (degrees) | 45° | 45° |
|  | Offset (mm)** | −2.7 | −1.35 |
| Transport layer thickness (mm) |  | 6.0 | 6.0 |
| Low index film | Thickness (mm) | 0.01 | 0.01 |
|  | Refractive index | 1.35 | 1.35 |

**Rings are formed by rotation of the lens cross section;
**Linear displacement along collector radius from the center of the ring..

Figure 21:
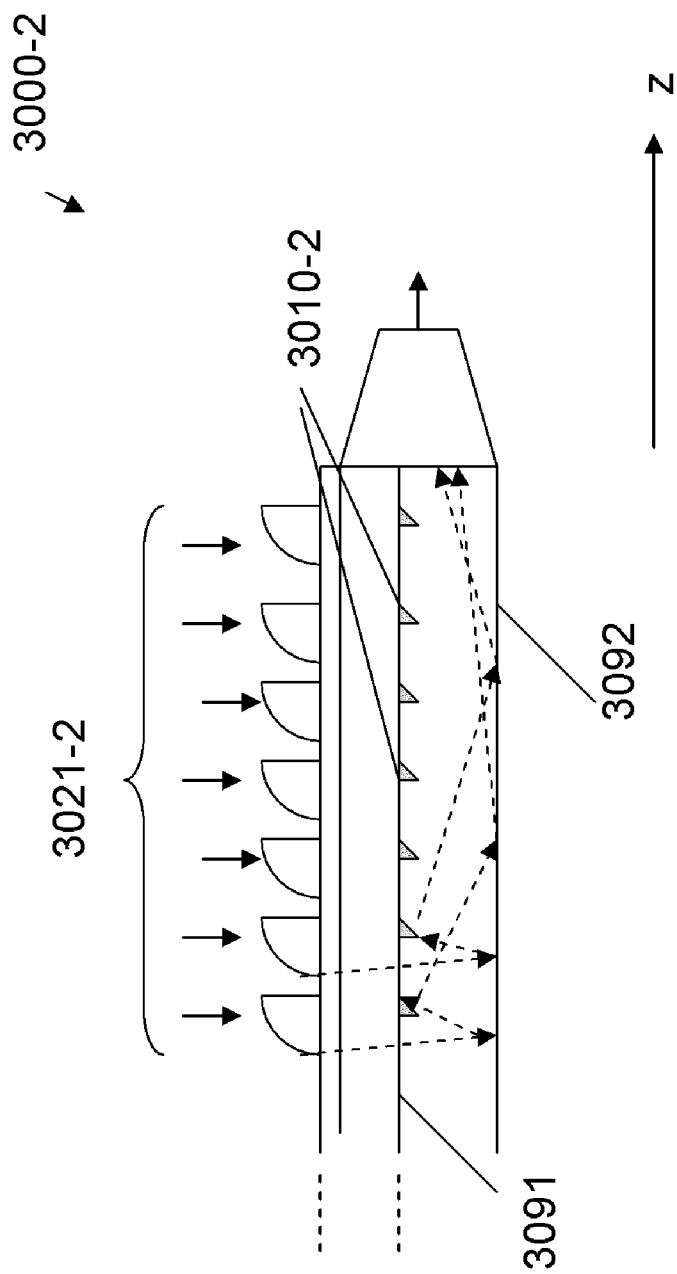
FIG. 21 shows a schematic, cross sectional view of a partial, equi-depth light collection and concentration system, according to an alternative aspect of the embodiment of FIG. 20C.

FIG. 21 illustrates an alternative, exemplary design of an equi-depth light collection and concentration system 3000-2. According to this aspect, the light injection elements 3010-2 are disposed in the top surface(s) 3091 of the light transport layer(s) and the bottom surface(s) 3092 of the light transport layer(s) is given reflective attributes to reflect light from the primary concentrator back up and onto the light injection elements (opposite that shown in FIG. 20C) as shown for example by the dotted arrows. This design may experience greater reflection losses as well as obscuration losses due to the refractive primary light concentrator(s). These obscuration losses may be mitigated by the use of a Fresnel lens primary concentrator 3302-1 as shown by example in FIG. 33 or, alternatively, by providing an inverted Fresnel lens 3302-2 (i.e., the orientation of the structured surface towards the short conjugate) as the primary concentrator as illustrated by example in FIG. 34, discussed further below.

Figure 22:
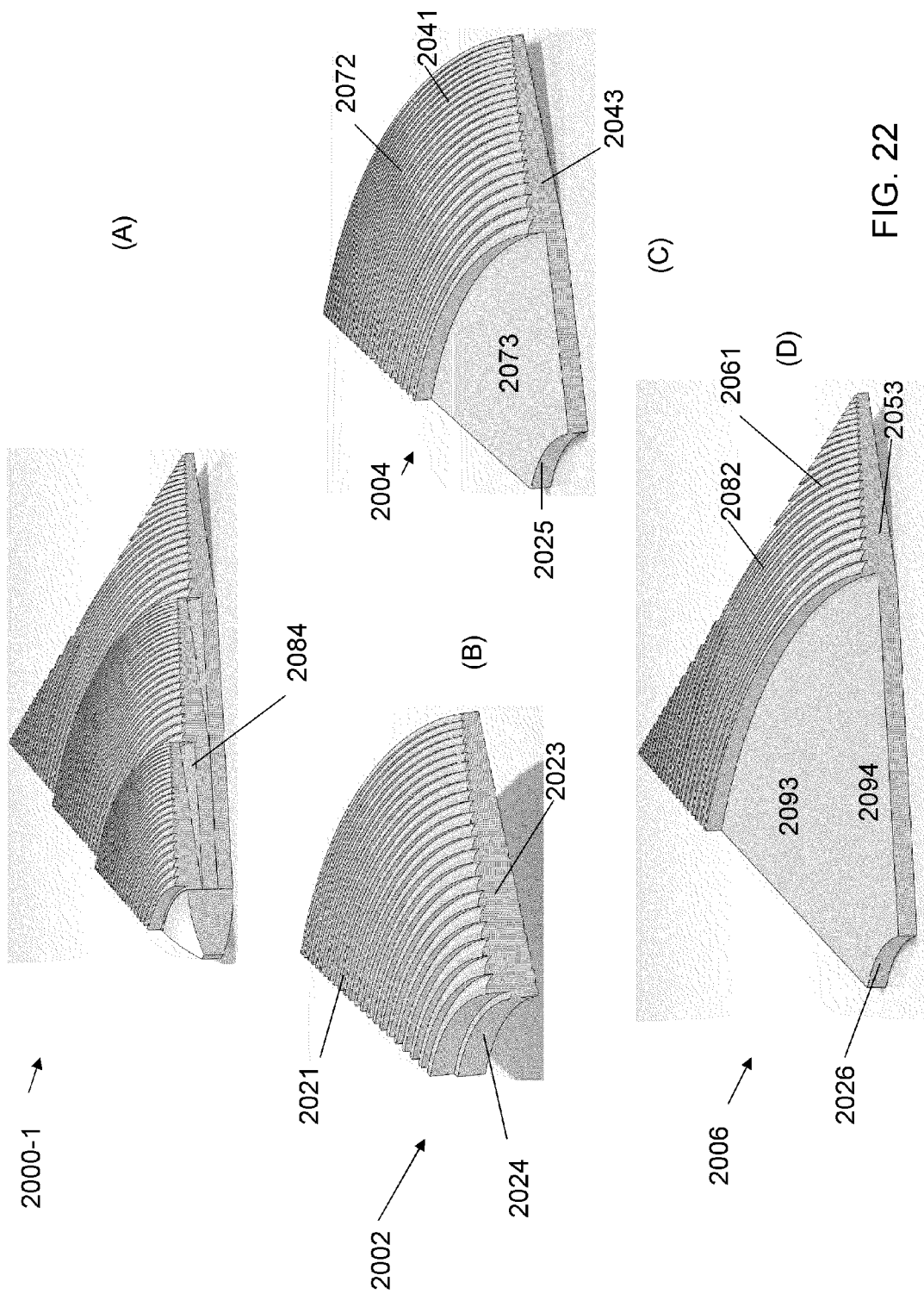
FIGS. 22(A, B, C, D) show, respectively, perspective cad-cam views of a compound light collection and concentration system; a first collector/transport section; a second collector/transport section; and, a third collector/transport section, according to an embodiment of the invention.

FIGS. 22(A-C) and 23(A, B) illustrate a 'compound', wedged light collection and concentration system 2000-1 according to an embodiment of the invention. The system includes a first collector segment 2002 that comprises a first light concentrating layer 2021, a first light transport layer 2023 characterized by an index of refraction $n_{1-1}$, having a respective side-end primary light exit surface 2024, and further including a plurality of light-directing elements 2010-1 disposed in a bottom surface thereof and extending inwardly therefrom at an angle to the bottom surface, in optical registration with the first light concentrating layer, and a first light transmissive medium layer 2081 characterized by an index of refraction $n_{2-1}$, where $n_{2-1} < n_{1-1}$, disposed between the first light concentrating layer and the first light transport layer. The system further includes at least a second collector segment 2004 having an outer portion 2072, that comprises a second light concentrating layer 2041, a second light transport layer 2043 characterized by an index of refraction $n_{1-2}$, and further including a plurality of light-directing elements 2010-2 disposed in a portion of a bottom surface thereof and extending inwardly therefrom at an angle to the bottom surface, in optical registration with the second light concentrating layer, and a second light transmissive medium layer 2083 characterized by an index of refraction $n_{2-2}$, where $n_{2-2} < n_{1-2}$, disposed between the second light concentrating layer and the second light transport layer. The at least a second collector segment 2004 also has an inner portion 2073 consisting of a plane parallel region of the second light transport layer and having a respective side-end primary light exit surface 2025, wherein the inner portion is disposed adjacent underneath the first light transport layer. The system further includes a light transmissive medium layer 2084 characterized by an index of refraction $n'_{2-2}$, where $n'_{2-2} \geq n_{2-2}$ and $< n_{1-2}$, disposed immediately adjacent a top surface of the plane parallel region of the second light transport layer.

According to an aspect, and with reference to FIGS. 22D and 23C, the compound light collection and concentration system may further comprise at least a third collector segment 2006 having an outer portion 2082 including a third light concentrating layer 2061, a third light transport layer 2053 characterized by an index of refraction $n_{1-3}$, and further including a plurality of light-directing elements 2010-3 disposed in a portion of a bottom surface thereof and extending inwardly therefrom at an angle to the bottom surface, in optical registration with the third light concentrating layer, and a third light transmissive medium layer 2085 characterized by an index of refraction $n_{2-3}$, where $n_{2-3} < n_{1-3}$, disposed between the third light concentrating layer and the third light transport layer. The at least third collector segment 2006 also has an inner portion 2093 consisting of a plane parallel region of the third light transport layer having a respective side-end primary light exit surface 2026, wherein the inner portion is disposed adjacent underneath the second light transport layer. The system further includes a light transmissive medium layer 2094 characterized by an index of refraction $n'_{2-3}$, where $n'_{2-3} \geq n_{2-3}$ and $< n_{1-3}$, disposed immediately adjacent a top surface of the plane parallel region of the third light transport layer.

Figure 23:
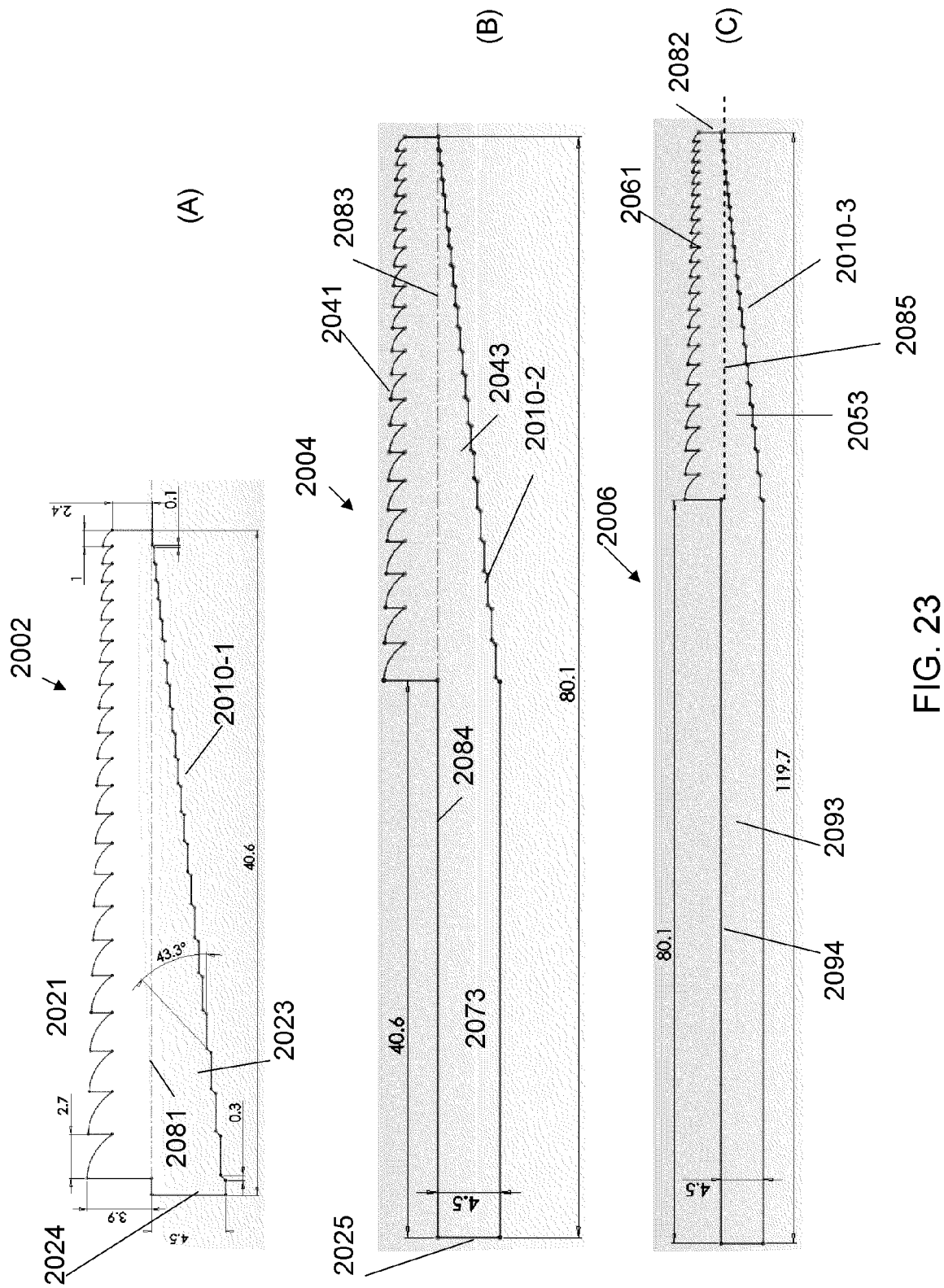
FIGS. 23(A, B, C) show, respectively, diagrammatic cross sectional views of the first, second, and third collector/transport sections illustrated in FIGS. 22(B, C, and D)

As further illustrated in FIG. 23, the bottom surfaces of the first and second (and third) light transport layers have a stepped shape between adjacent light directing elements of each said bottom surface. In the example illustrated in FIGS. 23(A-C), all three segments have identical focusing/turning portions that consist of 23 rings proportionally scaled along the radius (similar to that of the simple version of a wedged collector/concentrator system as shown in FIG. 19C.

Figure 24:
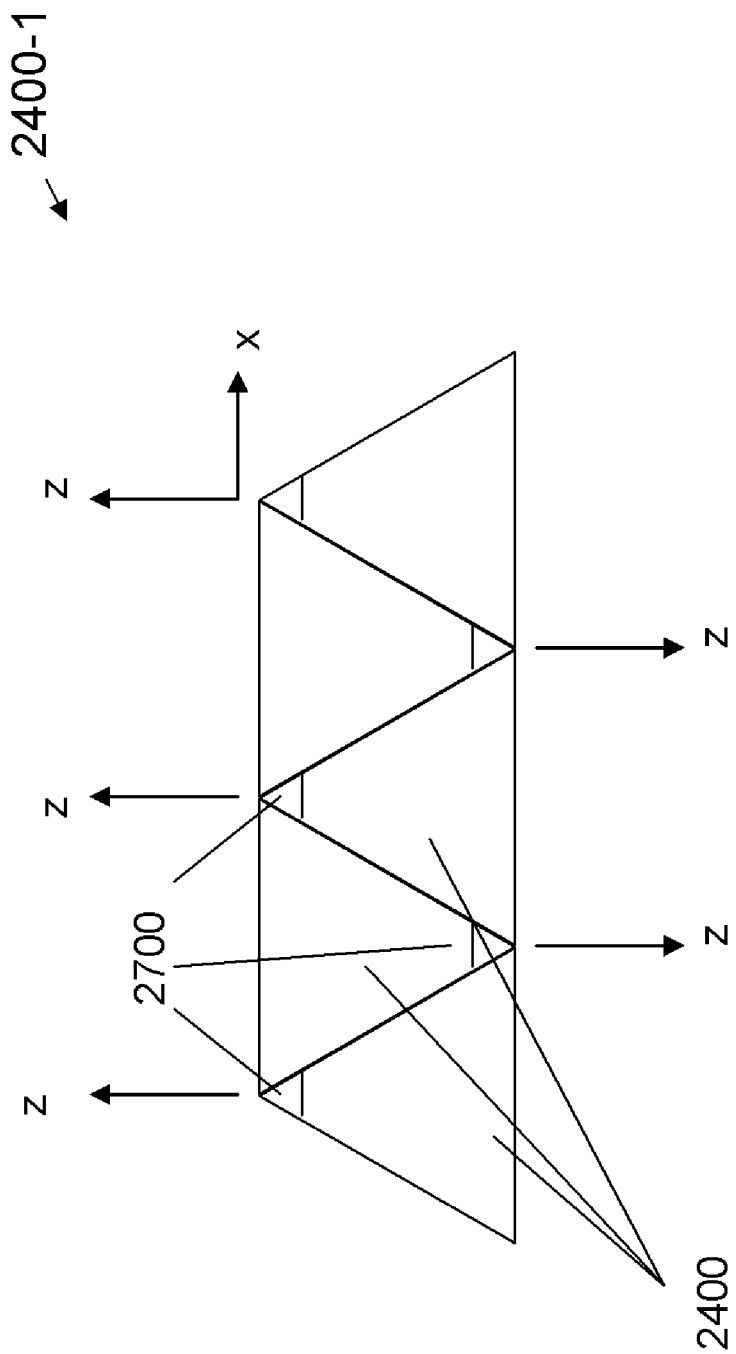
FIG. 24 is a top plan, diagrammatic view of a series of truncated pie-shaped light collection and concentration system assembled in a linear row format, according to an exemplary aspect of the invention.

As mentioned above with reference to FIG. 6A, the system may be in the shape (format) of a 360° rotationally symmetric, annular disc, wherein the side-end light exit surface(s) forms the annular origin of the rotationally symmetric system. The light collection and concentration system may alternatively take in the shape of one (see FIGS. 6B, 19A, 20A, 22A) or more (in combination) azimuthal (pie-shaped) sections as further illustrated, by example, in FIG. 24. The azimuth angle may extend up to 90° and an optimum slice dimension will be determined based upon particular design and performance considerations. FIG. 24 shows a multiple pie-segment system 2400-1 comprising a series of truncated, 45° pie-shaped light collection and concentration system segments 2400 assembled in a linear, row format. Each segment includes a secondary concentrator 2700 that would focus the z-direction traveling output light into a respective PV cell (not shown). The segments are referred to as truncated because the back edge of each segment has been rendered straight rather than curvilinear as in a disk-shaped system.

Figure 26:
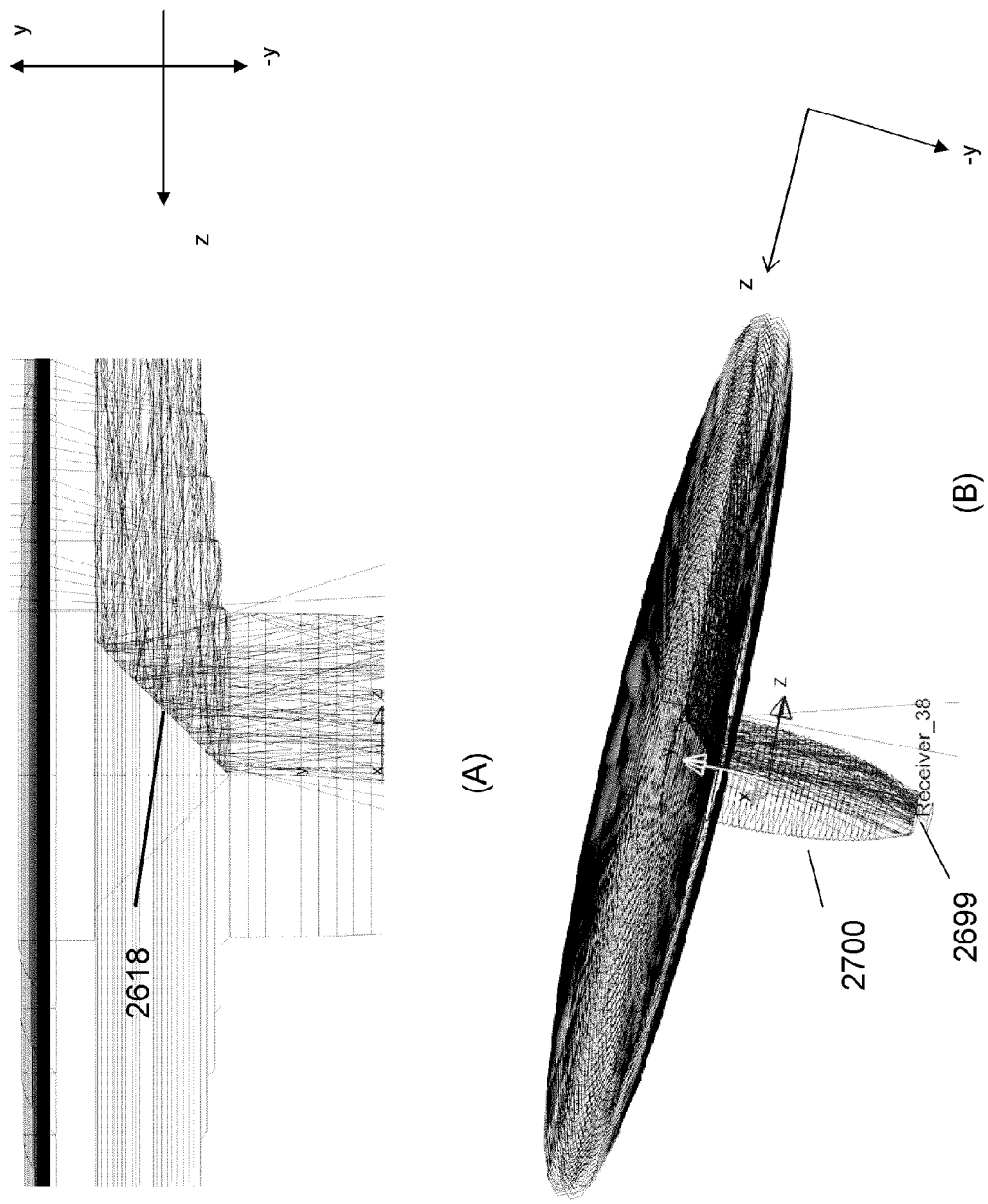
FIGS. 26(A, B) are, respectively, a diagrammatic cross sectional view of a rotationally symmetric light collection and concentration system showing a flat turning minor at the exit face of the light transport component; and, a perspective wire-frame view of a secondary concentrator coupled to the system of FIG. 26(A), according to an aspect of the invention.

If the light collection and concentration system has a rotationally symmetric, annular disk-shaped format as illustrated, for example, in FIGS. 6A and 26B, a single PV cell 2699 positioned at an appropriate distance along the (−)y-direction will be able to capture all of the output light if the output light is directed in the (−)y-direction either prior to or after secondary concentration. Thus as shown in FIG. 26A, a flat turning minor 2618 is positioned adjacent the exit face of the light transport layer and oriented at 45° thereto to deflect the output light from the z-axis along the (−)y axis. As shown in FIG. 26B, a secondary concentrator 2700 is located to intercept the deflected output light and concentrate the light into receiver (PV cell) 2699.

Figure 27:
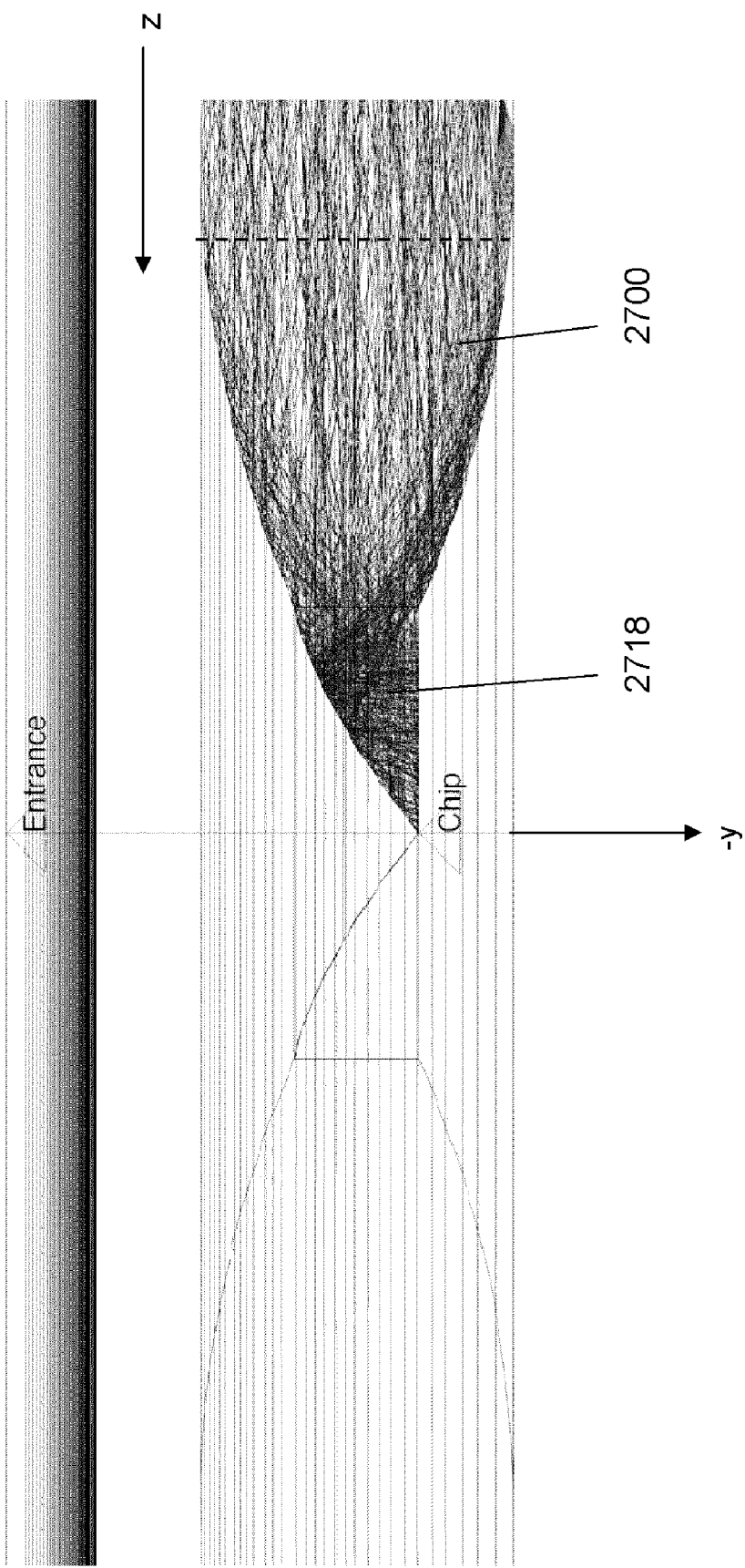
FIG. 27 is a diagrammatic cross sectional view of a rotationally symmetric light collection and concentration system showing a secondary concentrator with a curved mirror, according to an aspect of the invention.

Alternatively, as shown in FIG. 27, the secondary concentrator 2700 is coupled to the exit face of the light transport layer. A curved-surface minor 2718 is disposed immediately adjacent the output face of the secondary concentrator to drive the concentrated output light in the (−)y-direction to a PV cell (not shown).

FIG. 28a shows an exemplary light collector/concentrator system 2500-1 having a form factor that eliminates the system's overall wedge-like profile as seen, for example, in FIGS. 13, 14, 19, 22. The monotonically-slanted bottom surface 2544 of the light concentration layer 2500 contributes to a constant thickness (T) shape of the system that provides increased light concentration or light flux. As such, a secondary concentrator (2527) may or may not be used. Both the planar bottom surface 2544 of the primary concentrator 2500 and the planar top surface 2545 of the light transport structure 2510 are slanted with respect to the horizontal (dotted line) in a manner to give the system an overall planar aspect and constant thickness compared to a wedge-shaped system as disclosed above. A low index layer 2583 is shown sandwiched between the concentrator and transport layers. The top surface 2545 of the transport layer 2510 and the bottom surface 2544 of the collector 2500 should be parallel to each other along every given locality of the interface; i.e., it is not necessary that these surface be flat as shown in FIG. 28a. Rather, the interface can be of essentially arbitrary shape. For example, the profile can be curved as illustrated in device 2500-2 in FIG. 28b, as long as the local area around any point includes parallel interfacing surfaces. Together, these surfaces act as a window such that the light rays do not suffer angular deviation upon transmission there through. Between surfaces 2544 and 2545, the interface-film or gap 2583 has a constant thickness due to surfaces 2544 and 2545 being parallel to each other. An optional secondary concentrator 2527 is shown coupled to the exit end of the light transport layer in FIG. 28a.

Figure 28:
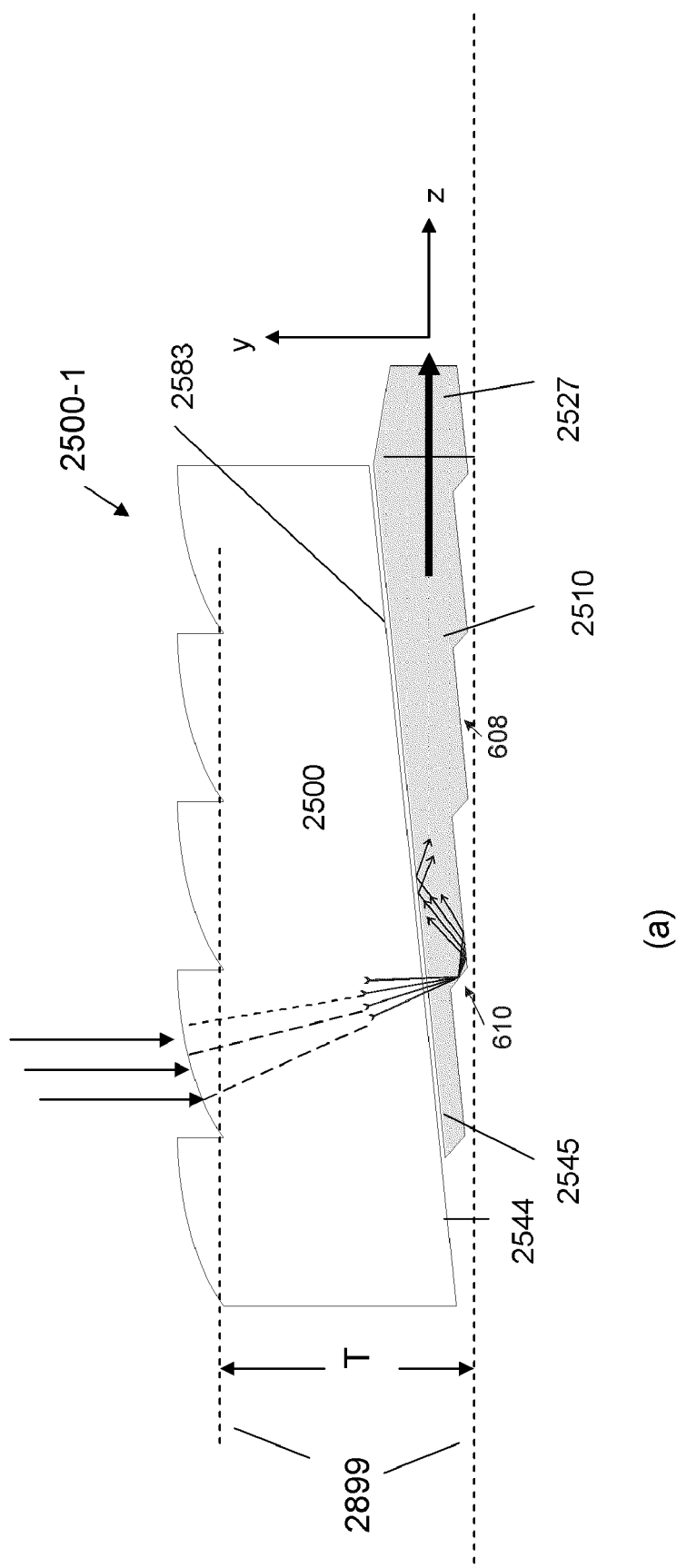
FIG. 28a is a schematic cross sectional view of a light collection and concentration system geometrically modified to have a planar rather than a wedge-like thickness profile, according to an exemplary aspect of the invention.
FIG. 28b shows an illustrative system having an irregular boundary profile between the collector and the transport layer, according to an exemplary aspect of the invention.
Figure 28:
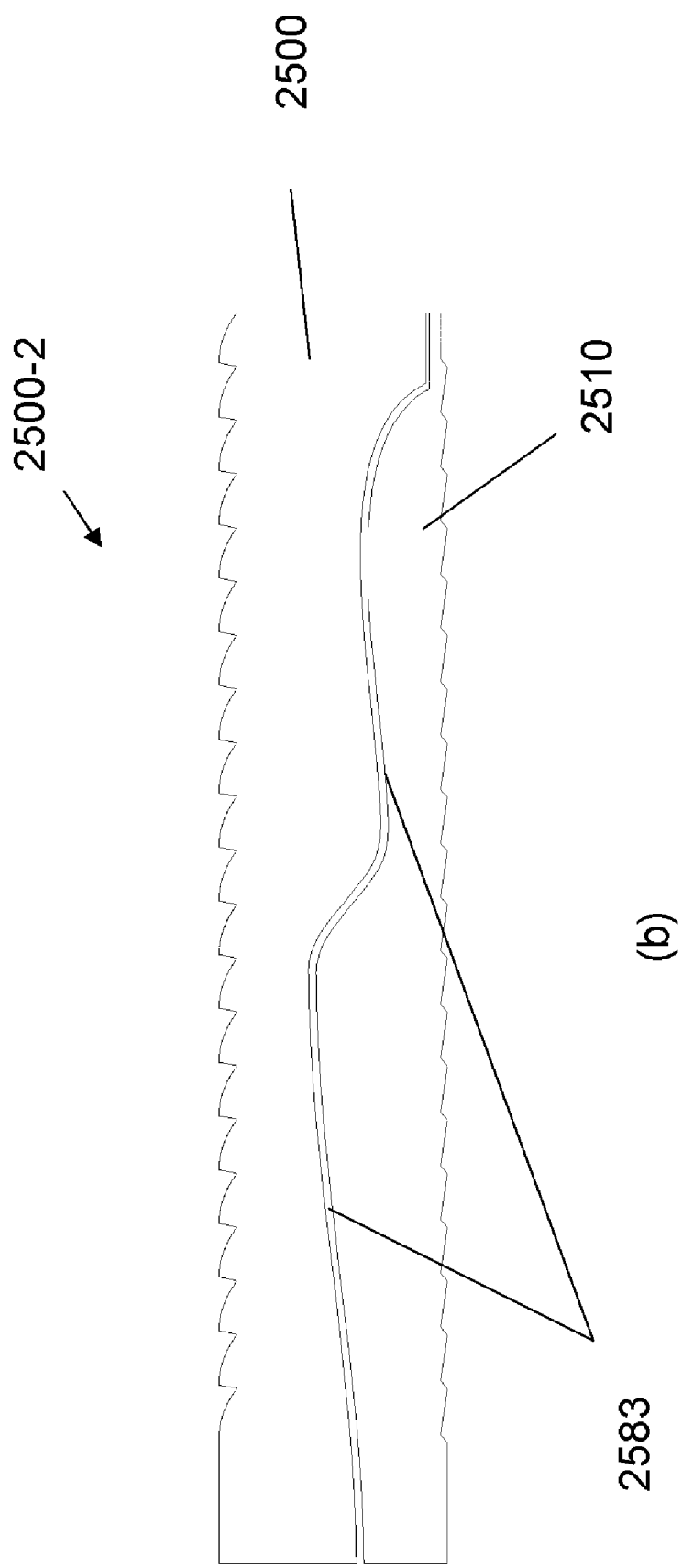
Figure 29:
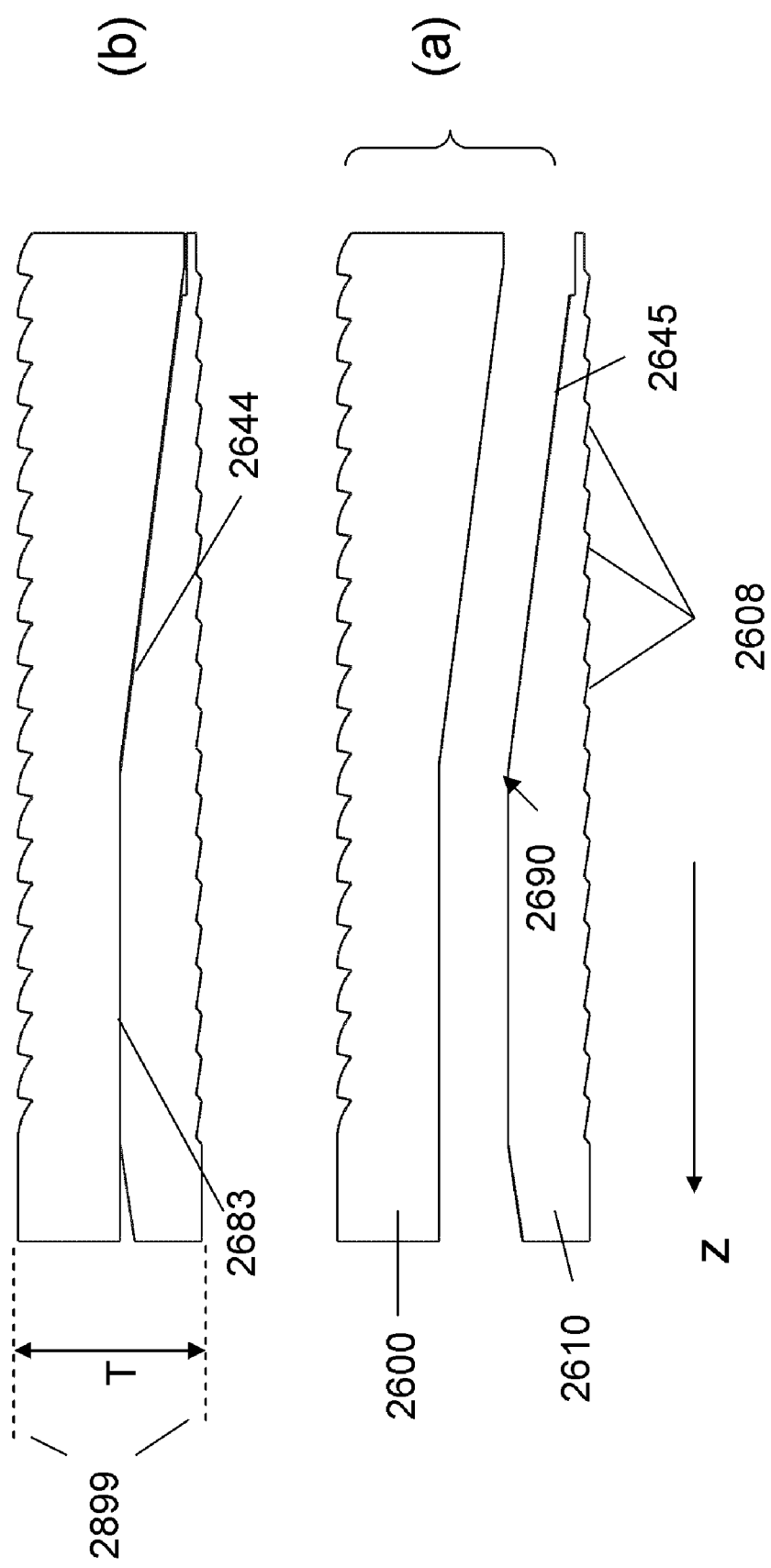
FIGS. 29(a, b), respectively, show in cross section an exploded view and an assembled view of an alternative geometry to that of FIG. 28a for a light collection and concentration system, according to an aspect of the invention.

Referring to FIGS. 28a and 29, it is not necessary that the surface portions 608, 2608, be parallel to the surfaces 2545, 2645. However, when surface portions 608, 2608 are parallel to the top surfaces of transport layers 2510, 2610, the light flux will be increased in the z-direction while the numerical aperture or throughput of the propagated beam remains constant. When surface portions 608, 2608 are not parallel to the referenced top surfaces, the optical flux again will be increased, but the numerical aperture will also be increasing. After a certain period, losses will be incurred as the TIR condition begins to fail. This situation can be used to increase the concentration ratio before reaching the PV cell, thus potentially avoiding the need for a secondary concentrator.

FIGS. 29a, 29b, respectively, show an exploded, cross sectional view and an assembled, cross sectional view of an alternative, constant thickness (T) system geometry to that shown in FIG. 28a for a light collection and concentration system according to an aspect of the invention. As illustrated in FIG. 29a, (from right to left) the waveguide (transport layer) 2610 monotonically increases in thickness up to a point (2690), at which point the waveguide maintains a constant thickness (the slight slant in the left-hand end is from an optional secondary concentrator shown attached in this figure). A thinner waveguide provides increased light concentration, however, at the expense of decreased efficiency (and vice versa). Accordingly, the desired balance between concentration and efficiency will dictate the overall design shape. As before, the top surface 2645 of the waveguide must be locally parallel to the bottom surface 2644 of the lens array-collector portion 2600. A low index layer 2683 (air or a material layer) is disposed between the lens array 2600 and the waveguide 2610 to facilitate TIR as a person skilled in the art would readily understand.

Figure 30:
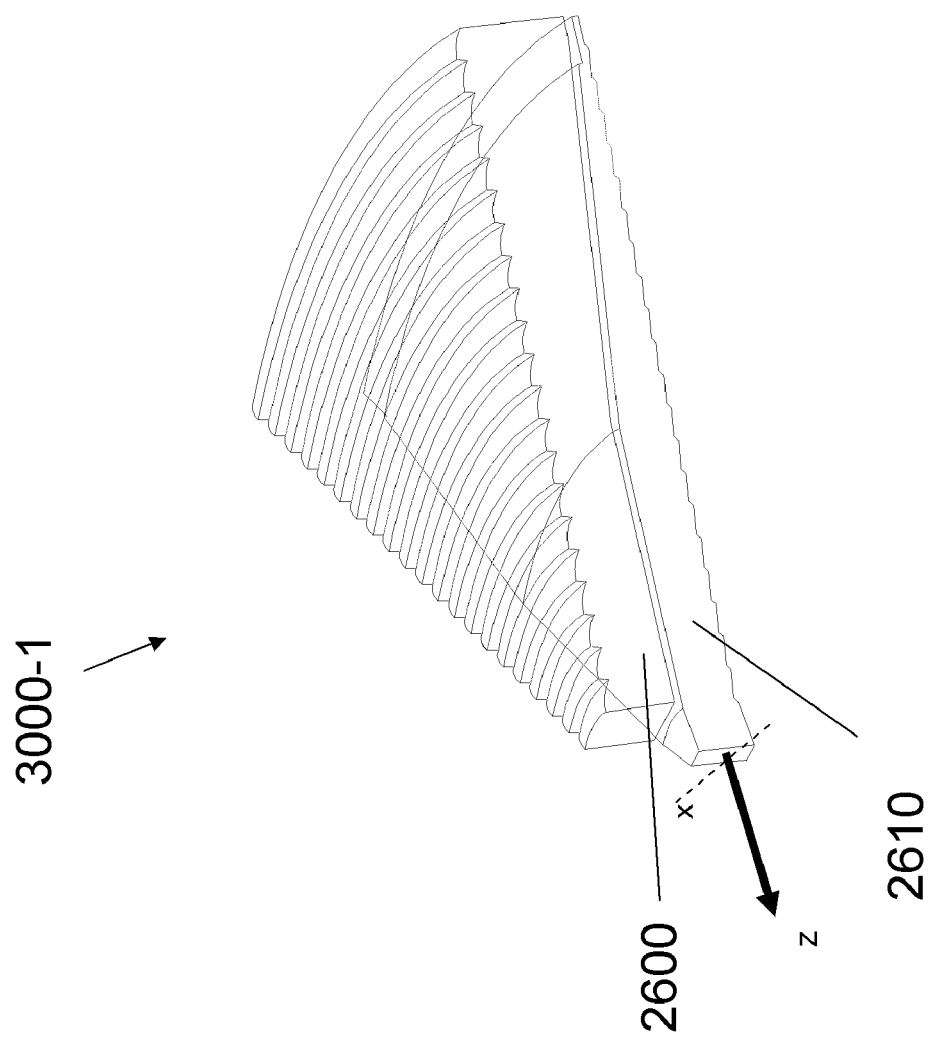
FIG. 30 shows a schematic perspective view of the assembled system shown in FIG. 29(b) according to an aspect of the invention.

FIG. 30 shows a schematic, perspective view of the assembled 'pie-shaped' system 3000-1 of FIG. 29b where concentrated light exits the system in the z-direction. The cross sectional shape of the light transport structure (waveguide) component 2610 functions to maintain (not increase) the numerical aperture for light propagating in the z-direction in the waveguide. The pie-shape of the system as illustrated in FIG. 30 assists in concentrating the light at the exit end of the waveguide. It will be appreciated that the optimum azimuthal extent (i.e., pie shape in x-direction) of the system will be determined on a case-by-case basis by a desired balance of light concentration and light losses at the system exit face. It will be further appreciated that the interface between the primary optical concentrator 2600 and the waveguide structure 2610 need not be limited to a particular planar shape as long as both contact surfaces are locally parallel, such that rays are not deflected out of the system when crossing the interface.

With respect to the aspects of the invention illustrated in FIGS. 28-30, it is to be clearly understood as expressly disclosed herein that the bottom surface of the light transport layer (waveguide), as may be described and claimed as portions thereof, is non-slanted with respect to dotted horizontal reference lines 2899, providing a constant overall thickness of the system; however, the bottom surface of the waveguide that includes the light directing elements has slanted portions or regions inter-connecting the light directing elements. The fact that the bottom waveguide surface has slanted inter-connecting surface regions in no way contradicts the meaning of the term 'non-slanted' as used herein and in the claims as applied to the overall orientation of the bottom waveguide surface.

Figure 31:
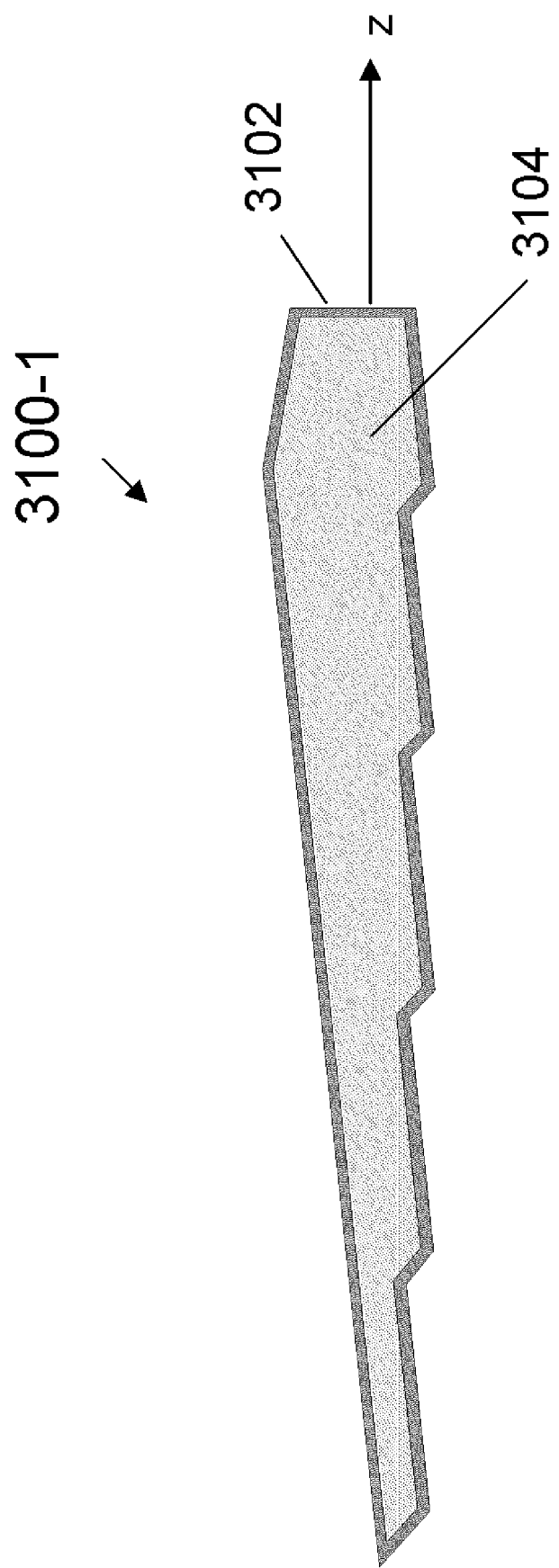
FIG. 31 is a schematic cross sectional view of a light transport structure component having an alternative (e.g., fluid) medium material according to an aspect of the invention.

According to an alternative aspect of the invention, the light transport component (waveguide) need not be a solid, monolithic material; rather, a light transport component 3100-1 as illustrated in FIG. 31 may comprise a suitably shaped enclosure 3102 that contains a fluid medium 3104 such as, but not limited to, a liquid. Practical considerations for a particular medium include the following: a) there must be enough transmission in the spectral band where the PV cell is operative, b) there must be sufficient resistance to environmental conditions (e.g., solar irradiation, temperature changes, etc.; if the medium is sensitive to UV degradation, a UV protector may be added to the medium or, e.g., a filter in the form of a thin film might be deposited in the optical enclosure), and c) the medium should be chemically inert such that materials in contact with the fluid medium do not absorb it or react with it. A PV cell can be separated physically from the fluid medium (but not optically) through a window. Exemplary liquid fluid media may include, but are not limited to, oils, water mixtures (polar and non-polar), and water soluble liquids like glycerol and ethylene glycol, which are transparent at visible wavelengths. Organic and inorganic compounds with —OH groups have noticeable absorption above a wavelength of ~1 micron (in the centimeter path length range). These liquids appear adequate for Silicon cells, GaAs, and GaInP, but not so much for Ge cells. Compared to solid PMMA, for example, these liquids offer similar properties in spectral transmission and perhaps better resistance properties. Other exemplary media include non-polar liquids such as Nujol™ oil, which may be more transmissive in the IR spectrum.

The transparent enclosure 3102 could be injected with the fluid medium 3104 and sealed during the manufacturing process. The waveguide properties may be shared by both the enclosure geometry and the fluid medium. It may not be necessary to completely fill the enclosure with the liquid medium. For example, a small gas bubble can be left inside the enclosure to accommodate thermal expansion of the fluid. The liquid should be degassed and remaining gas bubbles should be insoluble in the liquid. Alternatively, this degassing feature can be used as follows: e.g., when heating water (before boiling), air contained in it will precipitate in small bubbles at the recipient walls. The bubble growth can be induced in specific areas and remain there for optical injection using TIR just at the bubble interface. In another aspect, the media in the enclosure may include both solid and liquid parts.

Figure 32:
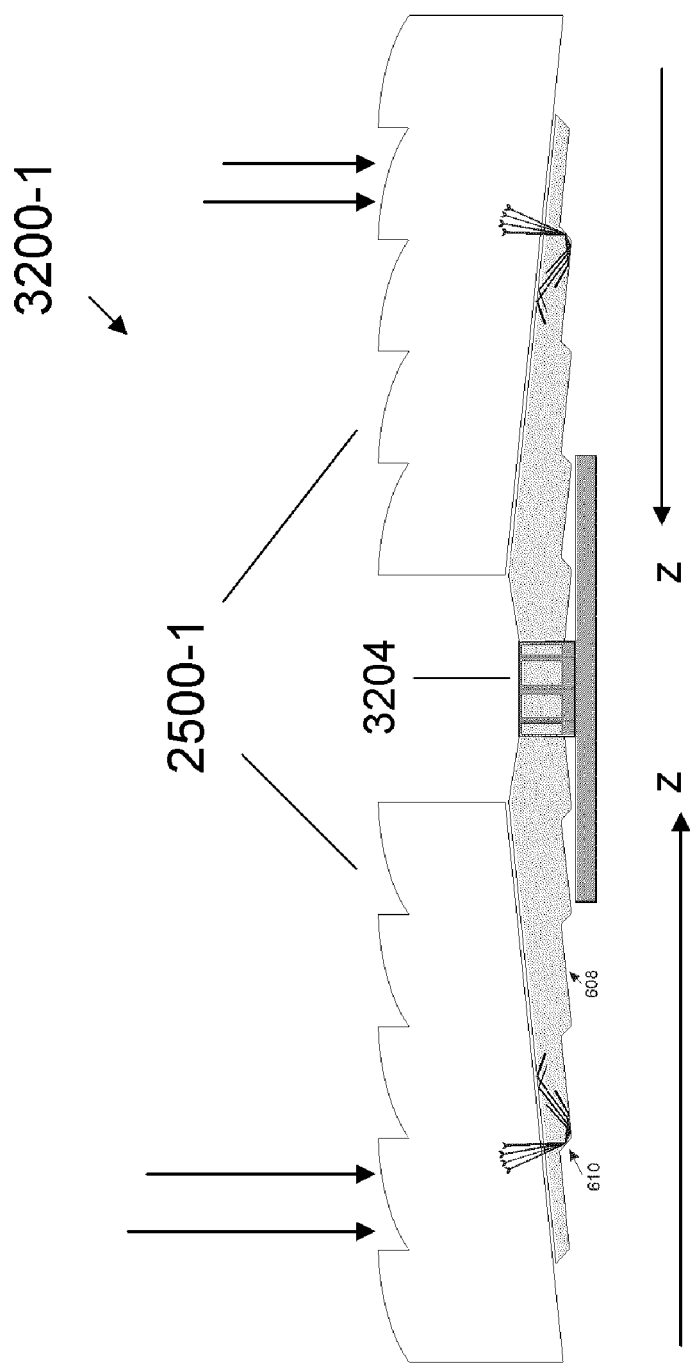
FIG. 32 is a schematic cross sectional view of a light collection and concentration system, according to an exemplary embodiment of the invention.

FIG. 32 shows a light collection and concentration system 3200-1 according to an illustrative embodiment of the invention. The system includes a plurality of light collection and concentration sub-systems 2500-1 as illustrated in FIG. 28, all of which are optically coupled at their respective exit faces to a polygon receiver 3204.

Figure 33:
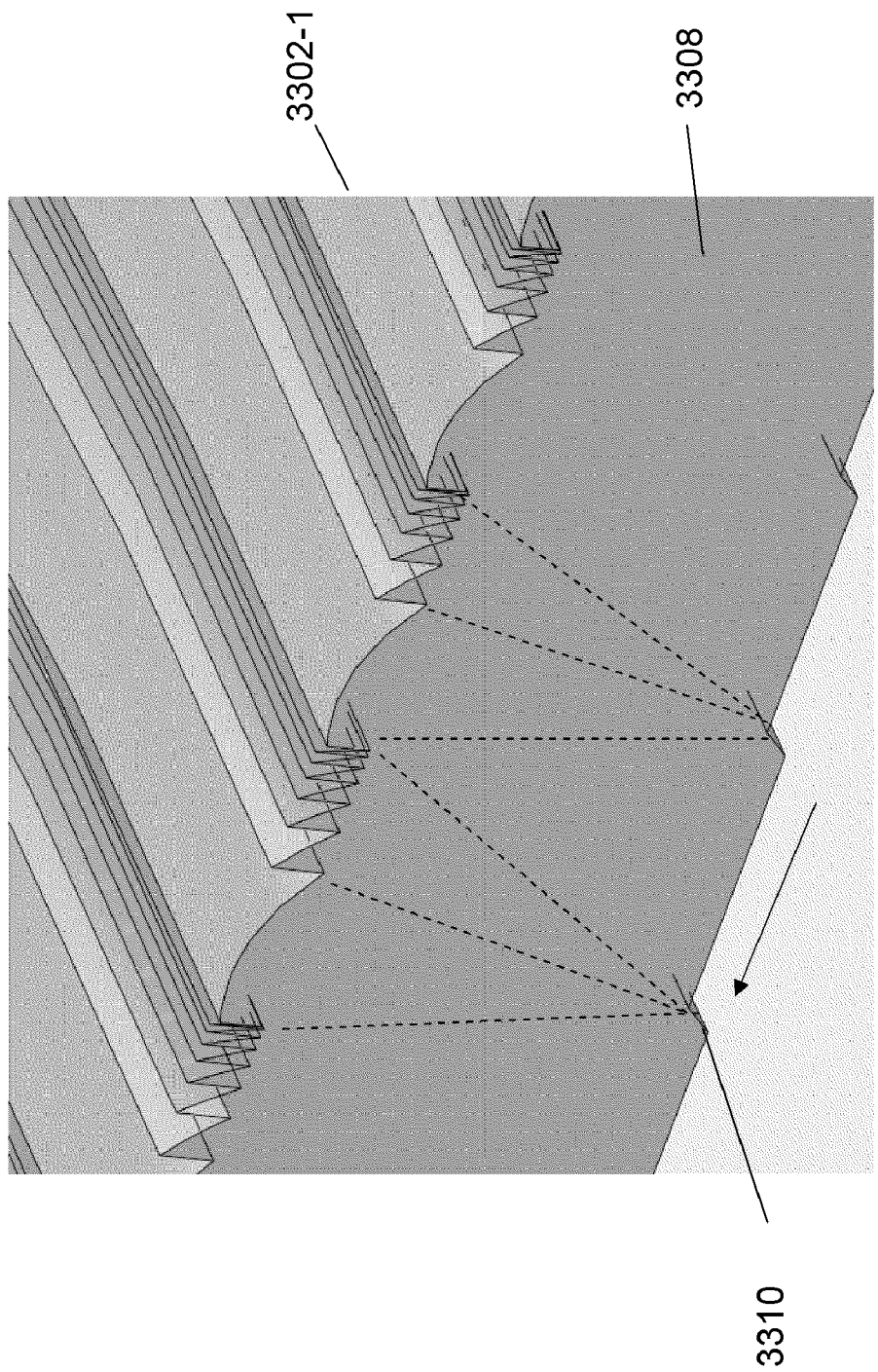
FIG. 33 is a perspective cad-cam view of a Fresnel lens primary concentrator, according to an aspect of the invention.

As previously disclosed herein, the primary concentrator may be a Fresnel lens, such as shown at 3302-1 in FIG. 33. In this case, the flat (non-structured) surface of the Fresnel lens is oriented towards the short conjugate. Incoming solar radiation is concentrated by the lens onto injection facets 3310 in the light transport structure 3308. In this orientation, a cover glass (not shown) may beneficially be positioned over the top of the structured lens surface.

Figure 34:
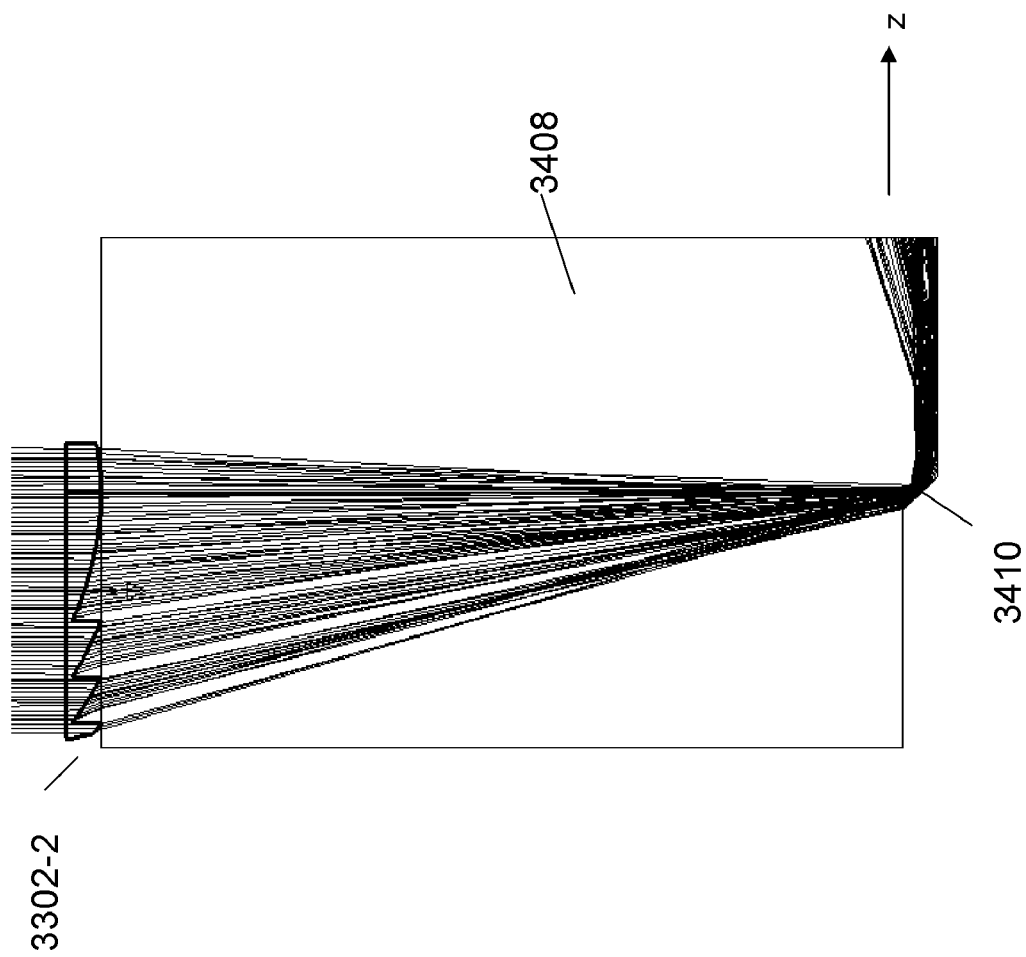
FIG. 34 is a diagrammatic cross sectional view of a section of a light collection and concentration system showing a Fresnel lens primary concentrator in reverse orientation to that shown in FIG. 33, according to an aspect of the invention.

Alternatively, the structured surface of the Fresnel lens may be oriented towards the short conjugate as shown at 3302-02 in FIG. 34. In this orientation, vertical surface losses on the lens are reduced while still exploiting the low profile of the Fresnel lens. In addition, the optional cover glass need not be used. Several Fresnel lens parameters may be adjusted for optimal design. These include f/#, ring width, ring center thickness, size of reflective surface of injection facet (3410), and lens offset (left/right).

The use of the terms "a" and "an" and "the" and similar references in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening.

The recitation of ranges of values herein are merely intended to serve as a shorthand method of referring individually to each separate value falling within the range, unless otherwise indicated herein, and each separate value is incorporated into the specification as if it were individually recited herein.

All methods described herein can be performed in any suitable order unless otherwise indicated herein or otherwise clearly contradicted by context. The use of any and all examples, or exemplary language (e.g., "such as") provided herein, is intended merely to better illuminate embodiments of the invention and does not impose a limitation on the scope of the invention unless otherwise claimed.

No language in the specification should be construed as indicating any non-claimed element as essential to the practice of the invention.

It will be apparent to those skilled in the art that various modifications and variations can be made to the present invention without departing from the spirit and scope of the invention. There is no intention to limit the invention to the specific form or forms disclosed, but on the contrary, the intention is to cover all modifications, alternative constructions, and equivalents falling within the spirit and scope of the invention, as defined in the appended claims. Thus, it is intended that the present invention cover the modifications and variations of this invention provided they come within the scope of the appended claims and their equivalents.

We claim:

1. A light collection and concentration system, comprising:
a light concentrating layer having a first section and at least a second section;
a first light transport layer characterized by an index of refraction $n_{1-1}$, including a plurality of light directing elements disposed in at least a portion of one of the top and bottom surfaces thereof in optical registration with the first section of the light concentrating layer, and having a respective side-end primary light exit surface;
a first light transmissive medium layer characterized by an index of refraction $n_{2-1}$, where $n_{2-1}<n_{1-1}$, disposed immediately adjacent the light concentrating layer and the first light transport layer;
at least a second light transport layer characterized by an index of refraction $n_{1-2}$, including a plurality of light directing elements disposed in at least one of the top and bottom surfaces thereof and in respective optical registration with the at least second section of the light concentrating layer, and having a respective side-end primary light exit surface; and
a respective at least second light transmissive medium layer characterized by an index of refraction $n_{2-2}$, where $n_{2-2}<n_{1-2}$, disposed immediately adjacent the first light transport layer and the second light transport layer.

2. The light collection and concentration system of claim 1, further comprising a secondary light concentrator optically coupled to the first and second side-end exit surfaces.

3. The light collection and concentration system of claim 1, wherein the light directing elements of the at least one of the first and second light transport layers are disposed in the top surface of the respective light transport layer, further comprising a light reflective layer disposed immediately adjacent the bottom surface of the respective light transport layer.

4. The light collection and concentration system of claim 1, wherein the light concentrating layer comprises Fresnel lenses.

5. A light collection and concentration system, comprising:
a first collector including:
a first light concentrating layer;
a first light transport layer characterized by an index of refraction $n_{1-1}$, having a respective side-end primary light exit surface, and further including a plurality of light-directing elements disposed in a bottom surface thereof and extending inwardly therefrom at an angle to the bottom surface, in optical registration with the first light concentrating layer; and
a first light transmissive medium layer characterized by an index of refraction $n_{2-1}$, where $n_{2-1}<n_{1-1}$, disposed between the first light concentrating layer and the first light transport layer; and
at least a second collector having an outer portion including:
a second light concentrating layer;
a second light transport layer characterized by an index of refraction $n_{1-2}$, and further including a plurality of light-directing elements disposed in a portion of a bottom surface thereof and extending inwardly therefrom at an angle to the bottom surface, in optical registration with the second light concentrating layer; and a second light transmissive medium layer characterized by an index of refraction $n_{2-2}$, where $n_{2-2}<n_{1-2}$, disposed between the second light concentrating layer and the second light transport layer, and an inner portion consisting of a plane parallel region of the second light transport layer having a respective side-end primary light exit surface, wherein the inner portion is disposed adjacent underneath the first light transport layer; and
a light transmissive medium layer characterized by an index of refraction $n'_{2-2}$, where $n'_{2-2} \geq n_{2-2}$ and $<n_{1-2}$, disposed immediately adjacent a top surface of the plane parallel region of the second light transport layer.

6. The light collection and concentration system of claim 5, further comprising:
at least a third collector having an outer portion including:
a third light concentrating layer;
a third light transport layer characterized by an index of refraction $n_{1-3}$, and further including a plurality of light-directing elements disposed in a portion of a bottom surface thereof and extending inwardly therefrom at an angle to the bottom surface, in optical registration with the third light concentrating layer; and
a third light transmissive medium layer characterized by an index of refraction $n_{2-3}$, where $n_{2-3}<n_{1-3}$, disposed between the third light concentrating layer and the third light transport layer, and an inner portion consisting of a plane parallel region of the third light transport layer having a respective side-end primary light exit surface, wherein the inner portion is disposed adjacent underneath the second light transport layer; and
a light transmissive medium layer characterized by an index of refraction $n'_{2-3}$, where $n'_{2-3} \geq n_{2-3}$ and $<n_{1-3}$, disposed immediately adjacent a top surface of the plane parallel region of the third light transport layer.

7. The light collection and concentration system of claim 6, wherein the bottom surface of the third light transport layer has a stepped shape.

8. The light collection and concentration system of claim 7, wherein each of a non-light-directing portion of the stepped surface are parallel to the opposing surface of the light transport layer.

9. The light collection and concentration system of claim 6, wherein the system is in the shape of a rotationally symmetric disc, further wherein the side-end light exit surface forms an annular origin of the rotationally symmetric system.

10. The light collection and concentration system of claim 9, wherein the system is in the shape of an azimuthal section of the disc.

11. The light collection and concentration system of claim 6, wherein the light transmissive medium layer characterized by an index of refraction $n'_{2-3}$ is air.

12. The light collection and concentration system of claim 6, wherein the third light concentrating layer is a Fresnel lens.

13. The light collection and concentration system of claim 12, wherein the Fresnel lens is disposed in a reverse Fresnel lens orientation.

14. The light collection and concentration system of claim 6, further comprising a secondary light concentrator optically coupled to the side-end exit surface.

15. The light collection and concentration system of claim 5, wherein the bottom surfaces of the first and second light transport layers have a stepped shape.

16. The light collection and concentration system of claim 15, wherein each of a non-light-directing portions of the stepped surfaces are parallel to the opposing surface of the light transport layer.

17. The light collection and concentration system of claim 5, wherein the system is in the shape of a rotationally symmetric disc, further wherein the side-end light exit surfaces form an annular origin of the rotationally symmetric system.

18. The light collection and concentration system of claim 17, wherein the system is in the shape of an azimuthal section of the disc.

19. The light collection and concentration system of claim 17, wherein the first and second light concentrating layers further comprise adjacent, annular light concentrating elements.

20. The light collection and concentration system of claim 19, wherein the annular light concentrating elements of the first and second light concentrating layers are scaled in relation to the stepped portions of the respective bottom surfaces.

21. The light collection and concentration system of claim 20, wherein the third light concentrating layer further comprises adjacent, annular light concentrating elements.

22. The light collection and concentration system of claim 21, wherein the annular light concentrating elements of the third light concentrating layer are scaled in relation to the stepped portion of the third light transport layer.

23. The light collection and concentration system of claim 5, wherein the light transmissive medium layer characterized by an index of refraction $n'_{2-2}$ is air.

24. The light collection and concentration system of claim 5, wherein the first and second light concentrating layers are Fresnel lenses.

25. The light collection and concentration system of claim 24, wherein the Fresnel lenses are disposed in a reverse Fresnel lens orientation.

26. The light collection and concentration system of claim 5, further comprising a secondary light concentrator optically coupled to the side-end exit surfaces.

27. The light collection and concentration system of claim 26, further comprising a turning mirror coupled to a light exit surface of the secondary light concentrator.

28. The light collection and concentration system of claim 27, wherein the turning mirror has a curved reflecting surface.

* * * * *